US 6,613,678 B1

United States Patent
Sakaguchi et al.

(10) Patent No.: US 6,613,678 B1
(45) Date of Patent: Sep. 2, 2003

(54) PROCESS FOR MANUFACTURING A SEMICONDUCTOR SUBSTRATE AS WELL AS A SEMICONDUCTOR THIN FILM, AND MULTILAYER STRUCTURE

(75) Inventors: Kiyofumi Sakaguchi, Yokohama (JP);
Takao Yonehara, Atsugi (JP);
Nobuhiko Sato, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/312,843

(22) Filed: May 17, 1999

(30) Foreign Application Priority Data

May 15, 1998 (JP) .......................... 10-133912
May 13, 1999 (JP) .......................... 11-132985

(51) Int. Cl.⁷ .......................................... H01L 21/311
(52) U.S. Cl. ..................... 438/695; 438/745; 438/753
(58) Field of Search ................. 438/455, 456, 438/457, 458, 459, 695, 745, 753

(56) References Cited

U.S. PATENT DOCUMENTS

| 5,371,037 A |   | 12/1994 | Yonehara ............... 437/86 |
| 5,374,564 A |   | 12/1994 | Bruel ..................... 437/24 |
| 5,915,193 A | * | 6/1999  | Tong et al. .............. 438/455 |
| 5,966,620 A | * | 10/1999 | Sakaguchi et al. ...... 438/455 |
| 5,989,981 A | * | 11/1999 | Nakashima et al. ..... 438/695 |
| 6,008,110 A | * | 12/1999 | Samata et al. .......... 438/459 |
| 6,100,166 A | * | 8/2000  | Sakaguchi et al. ...... 438/455 |

FOREIGN PATENT DOCUMENTS

| EP | 0 553 852 | 8/1993 |
| EP | 0 767 486 | 4/1997 |
| EP | 0 817 248 | 1/1998 |
| EP | 0 843 344 | 5/1998 |
| EP | 0 917 193 | 5/1999 |
| JP | 5-211128  | 8/1993 |
| JP | 7-302889  | 11/1995 |
| JP | 9-22993   | 1/1997 |
| KR | 98-5365   | 3/1998 |

OTHER PUBLICATIONS

B. Aspar, et al., "Basic mechanisms involved in the Smart–Cut© process", Microelectronic Engineering, vol. 36, pp. 233–240 (1997).
P.K. Chu, "Synthesis of SOI Materials Using Plasma Immersion Ion Implantation", Mat. Res. Soc. Symp. Proc., vol. 438, pp. 333–343 (1997).
M. Miyazaki, et al., "Microstructure Observation of 'Crystal–Originated Particles' on Silicon Wafers", Jpn. J. Appl. Phys., vol. 34, pp. 6303–6307 (1995).
C. Maddalon–Vinante, et al., "Influence of rapid thermal annealing and internal gettering on Czochralski–grown silicon", J. Appl. Phys., vol. 79, No. 5, pp. 2707–2711 (1996).

(List continued on next page.)

Primary Examiner—Robert Kunemund
Assistant Examiner—Duy-Vu Deo
(74) Attorney, Agent, or Firm—Fitzpatrick, Cella, Harper & Scinto

(57) ABSTRACT

A process for manufacturing a semiconductor substrate, comprising the step of preparing a first substrate which has a surface layer portion subjected to hydrogen annealing, the separation-layer formation step of implanting ions of hydrogen or the like into the first substrate from the side of the surface layer portion, thereby to form a separation layer, the adhesion step of bonding the first substrate and a second substrate to each other so that the surface layer portion may lie inside, thereby to form a multilayer structure, and the transfer step of separating the multilayer structure by utilizing the separation layer, thereby to transfer the less-defective layer of the surface layer portion onto the second substrate. The less-defective layer is a single-crystal silicon layer in which defects inherent in a bulk wafer, such as COPs and FPDs, are decreased.

60 Claims, 12 Drawing Sheets

OTHER PUBLICATIONS

I. Fusegawa, et al., "Review of the Influence of Micro Crystal Defects in Silicon Single Crystals on Gate Oxide Integrity", Material Science Forum, vols. 196–201, pp. 1683–1690 (1995).

T. Cai, "Elimination of stacking faults in a silicon epitaxial layer of (100) orientation by heat treatment", J. Appl. Phys., vol. 67, No. 11, pp. 7176–7178 (1990).

Y. Yanase, et al., "Atomic Force Microscope Observation of the Change in Shape and Subsequent Disappearance of 'Crystal–Originated Particles' after Hydrogen–Atmosphere Thermal Annealing", Jpn. J. Appl. Phys., vol. 37, pp. 1–4 (1998).

William G. En, et al., "The Genesis Process: A New SOI Wafer Fabrication Method", Proc. 1998 IEEE Intl. SOI Conf., pp. 163–164 (1998).

Takao Yonehara, et al., "Epitaxial Layer Transfer by Bond and Etch Back of Porous Si", Appl. Phys. Lett., vol. 64, No. 16, pp. 2108–2110 (1994).

Takao Abe, "Reduction of Flow Pattern Defect (FPD) Density in the Wafer Bonding Process", Extended Abstracts of the Electrochem. Soc. Spring Meeting, vol. 95–1, p. 596 (1995).

M. Bruel, "Silicon On Insulator Material Technology", Electronics Lett., vol. 31, No. 14, pp. 1201–1202 (1995).

G.W. Cullen, ed., "Single–Crystal Silicon on Non–Single–Crystal Insulators", J. Crystal Growth, vol. 63, No. 3, pp. 429–590 (1983).

* cited by examiner

TEMPERATURE-DEPENDENCE OF ETCHING RATE
DEPENDENT UPON MATERIAL OF OPPOSING SURFACE

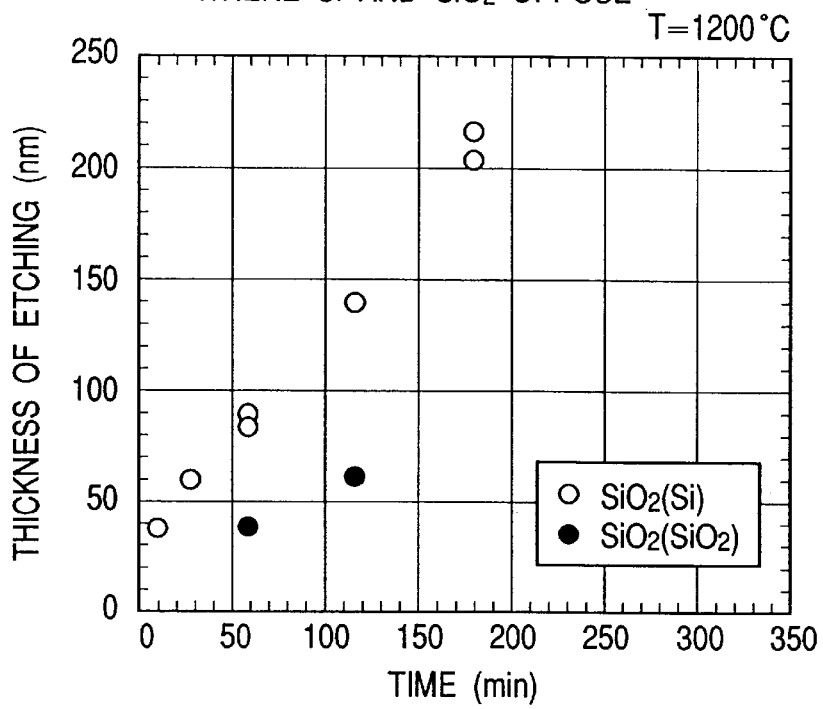
FIG. 17 QUANTITY OF ETCHING IN CASES WHERE Si AND SiO2 OPPOSE
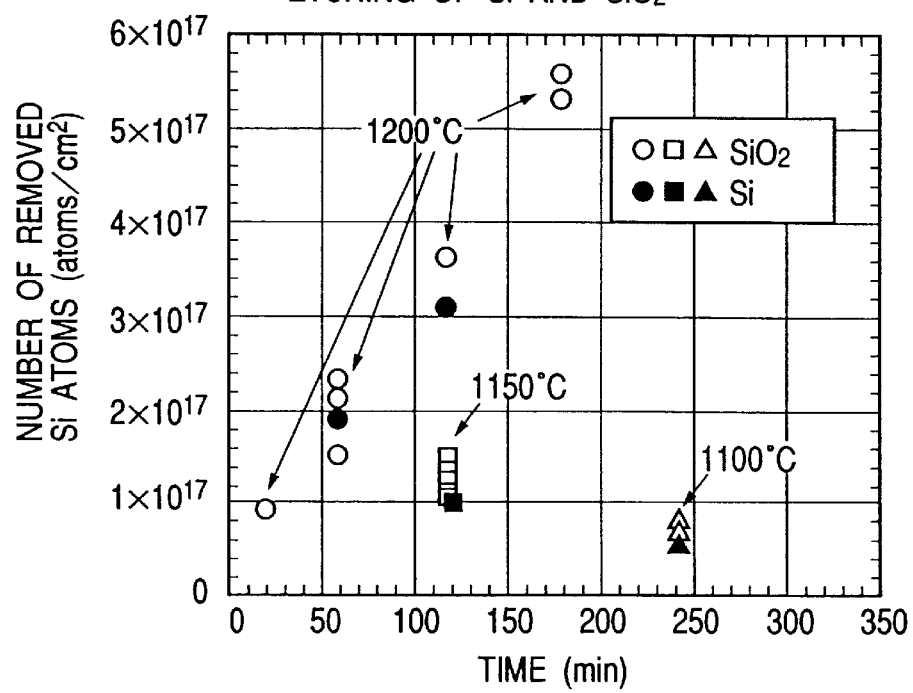
FIG. 18 NUMBER OF Si ATOMS REMOVED BY ETCHING OF Si AND SiO2

PROCESS FOR MANUFACTURING A SEMICONDUCTOR SUBSTRATE AS WELL AS A SEMICONDUCTOR THIN FILM, AND MULTILAYER STRUCTURE

BACKGROUND OF THE INVENTION

1. Field of the Invention

The present invention relates to a process for manufacturing a semiconductor substrate as well as a semiconductor thin film. More particularly, it relates to processes for manufacturing a semiconductor substrate which has a single-crystal semiconductor layer on an insulator layer, and a single-crystal compound semiconductor which overlies a Si (silicon) substrate. Further, it relates to a multilayer structure suitable for an electron device or an integrated circuit which is to be produced in a single-crystal semiconductor layer, and a process for manufacturing the multilayer structure.

2. Related Background Art

The formation of a single-crystal Si semiconductor layer on an insulator has been extensively known as "silicon on insulator (SOI)" technology. Since devices utilizing the SOI technology have numerous advantages unattainable with conventional bulk Si substrates for producing Si integrated circuits (ICs), many researches have been made. More specifically, the utilization of the SOI technology brings forth such advantages as follows:

(1) Dielectric isolation is easy enough to heighten the density of integration.
(2) A resistance against radiation is excellent.
(3) A stray capacitance can be lowered to achieve a higher operating speed.
(4) The steps of forming wells can be dispensed with.
(5) The device can be prevented from latching up.
(6) A fully depleted FET (field-effect transistor) can be produced owing to thinned films.

(These features are detailed in, for example, Special Issue: "Single-crystal silicon on non-single-crystal insulators" edited by G. W. Cullen, Journal of Crystal Growth, volume 63, no. 3, pp. 429–590 (1983).)

Further, in recent several years, SOI has been reported in a large number of papers as a substrate which realizes the higher operating speed and lower power dissipation of a MOSFET (Metal-Oxide-Semiconductor FET) (IEEE SOI Conference 1994).

Besides, with an SOI structure wherein a supporting substrate is overlaid with an SOI layer through an insulator layer, the insulator layer comes to exist under circuit elements, and hence, an element isolating process can be simplified as compared with that in the case of forming elements on a bulk Si wafer. As a result, a process for producing a device which employs the SOI structure is shortened.

That is, a MOSFET or an IC which is produced on the SOI is expected of, conjointly with enhancement in performance, curtailment in a wafer cost and a process cost in total as compared with that which is produced on bulk Si.

Among all such devices, the fully depleted (FD) MOSFET is expected to heighten its operating speed and lower its power dissipation owing to an enhanced driving force. In general, the threshold voltage ($V_{th}$) of a MOSFET is determined by the impurity concentration of the channel thereof. In the case of the FD MOSFET employing the SOI, however, the thickness of the depletion layer thereof is also affected by the film thickness and film quality of the SOI.

Accordingly, uniformity in the thickness of an SOI film and enhancement in the quality of the SOI film have been eagerly desired for producing a large-scale integrated circuit (LSI) at a good available percentage.

Researches on the formation of SOI substrates have been vigorous since the 1970's. Earnestly studied at the early stage were a process (SOS: Silicon on Sapphire) wherein single-crystal Si is hetero-epitaxially grown on a sapphire substrate being an insulator, a process (FIPOS: Full Isolation by Porous Oxidized Silicon) wherein an SOI structure is formed by dielectric isolation based on the oxidation of porous Si, and oxygen ion implantation.

Apart from the processes for forming the SOI substrates as mentioned above, processes for forming SOI substrates as are called "bonding or adhesion techniques" have been being established in recent years.

One of the bonding techniques is stated by M. Bruel in "Electronics Letters, 31 (1995), p. 1201", the official gazette of Japanese Patent Application Laid-Open No. 5-211128, and U.S. Pat. No. 5,374,564.

This bonding technique is a process termed "Smart Cut Process" (registered trademark), which consists chiefly of five steps and which will be explained below in conjunction with the drawings.

(First Step) A first silicon substrate (bulk wafer) 41 having an oxide film 43 on its surface is prepared as shown in FIG. 24.

(Second Step) The first silicon substrate 41 is implanted with hydrogen ions from the side of the oxide film 43 (FIG. 25). The hydrogen ions are implanted down to a desired depth at which the substrate 41 is to be separated by the later step. A layer 44 of minute gaseous bubbles called "microbubbles" or "microblisters" is formed in a region implanted with the hydrogen ions.

(Third Step) The resulting first silicon substrate 41 and a second substrate 46 to become a supporting substrate are bonded to each other so that the oxide film 43 may lie inside (FIG. 26).

(Fourth Step) After the bonding, the resulting structure is heat-treated at low temperatures of 400° C. to 600° C. or so. Then, as shown in FIG. 27, the first substrate 41 having been bonded on the second substrate 46 is separated or divided with the boundary at the minute bubble layer 44. More specifically, the heat treatment rearranges the crystals of the minute bubble layer 44 and also causes the microbubbles to coalesce, whereby gaseous macrobubbles are produced. Pressures within the macrobubbles act to highly stress the minute bubble region and the vicinity thereof. Consequently, the substrate 41 is separated at the bubble layer 44.

(Fifth Step) Thereafter, the resulting structure which includes the supporting substrate 46 is heat-treated at high temperatures in order to stabilize the interface of the bonding and to heighten the strength thereof. Subsequently, the minute bubble layer 44 which remains on an SOI layer 42 as shown in FIG. 27 is polished away as shown in FIG. 28.

Via the above steps, the first silicon substrate (bulk wafer) is partly transferred onto the second substrate, and the SOI substrate can be obtained.

In the case where the SOI layer is formed by utilizing the implantation with the ions of hydrogen or the like as stated above, the ion-implanted region substantially determines the thickness of the SOI layer. It is therefore important how the desired implantation region (thickness of the SOI layer) is defined at a high controllability.

Besides, since the SOI layer itself is formed on the basis of the bulk wafer, it involves defects or flaws peculiar to the bulk wafer, such as OSFs (Oxidation Induced Stacking Faults), COPs (Crystal Originated Particles) and FPDs (Flow Pattern Defects).

Herein, the defects of the OSFs etc. form causes for increasing a leakage current when they exist in an element operation region near the surface of the wafer. It has therefore been desired to establish a process for manufacturing an SOI substrate which is free from the OSFs etc. or in which the OSFs etc. are less.

By the way, the OSFs and COPs (Hidekazu Yamamoto: "Problems of Large-diameter Silicon Wafer to be Solved", 23rd Ultraclean Technology College (August 1996)) and the FPDs (T. Abe: Extended Abst. Electrochem. Soc., Spring Meeting, vol. 95-1, p. 596 (May, 1995)) will be explained later.

SUMMARY OF THE INVENTION

An object of the present invention is to provide a process for manufacturing a semiconductor thin film which is smaller in the number of defects and whose thickness is highly uniform.

Another object of the present invention is to provide a process for manufacturing an SOI substrate in which the thickness of an SOI layer is highly uniform.

Another object of the present invention is to provide a process for manufacturing a semiconductor thin film which is free from defects peculiar to a bulk silicon wafer, such as OSFs, COPs and FPDs, or in which they are less.

Still another object of the present invention is to provide a process for manufacturing an SOI substrate which is made more economical by reusing a substrate material in the manufacture of the SOI substrate based on a bonding technique.

By the way, in the present invention, the expression "SOI substrate" shall cover, not only a substrate which has a single-crystal silicon layer (SOI layer) on an insulator layer, but also a substrate which has a compound semiconductor layer of GaAs, InP or the like on a supporting substrate.

The process of the present invention for manufacturing a semiconductor substrate is characterized by comprising the step of preparing a first substrate which has a surface layer portion subjected to hydrogen annealing; the separation-layer formation step of implanting ions of at least one element selected from the group consisting of hydrogen, nitrogen and rare gases, into said first substrate from a side nearer to said surface layer portion, thereby to form a separation layer; the bonding step of bonding said first substrate and a second substrate to each other so that said surface layer portion may lie inside, thereby to form a multilayer structure; and the transfer step of separating said multilayer structure by utilizing said separation layer, thereby to transfer at least part of said surface layer portion onto said second substrate.

The process of the present invention for manufacturing a semiconductor substrate is also characterized in that, in said surface layer portion of said first substrate transferred on said second substrate, the number of COPs per unit wafer decreases with a depth of said surface layer portion as measured from an outside surface thereof.

The process of the present invention for manufacturing a semiconductor substrate is further characterized by the step of heat-treating said surface layer portion of said first substrate transferred on said second substrate, in a reducing atmosphere containing hydrogen, after said transfer step.

In another aspect of performance, the process of the present invention for manufacturing a semiconductor substrate is characterized by comprising the step of preparing a first silicon substrate which has a surface layer portion subjected to hydrogen annealing; the separation-layer formation step of implanting ions of at least one element selected from the group consisting of hydrogen, nitrogen and rare gases, into said first silicon substrate from a side nearer to said surface layer portion, thereby to form a separation layer; the step of bonding said first substrate and a second substrate to each other, thereby to form a multilayer structure; the step of heat-treating the first and second substrates at a first temperature while said multilayer structure is being formed or after said multilayer structure has been formed; the transfer step of separating said multilayer structure at said separation layer, thereby to transfer at least part of said surface layer portion onto said second substrate; and the step of heat-treating said surface layer portion transferred on said second substrate, at a second heat-treating temperature which is higher than the first heat-treating temperature.

In addition, the process of the present invention for manufacturing a semiconductor thin film is characterized by comprising the step of preparing a first silicon substrate which has a surface layer portion subjected to hydrogen annealing; the separation-layer formation step of implanting ions of at least one element selected from the group consisting of hydrogen, nitrogen and rare gases, into said first silicon substrate from a side nearer to said surface layer portion, thereby to form a separation layer; and the separation step of separating at least part of said surface layer portion at said separation layer.

Furthermore, the process of the present invention for manufacturing a semiconductor substrate is characterized by comprising the step of heat-treating a silicon substrate in a reducing atmosphere which contain hydrogen; the separation-layer formation step of implanting ions of at least one element selected from the group consisting of hydrogen, nitrogen and rare gases, into said silicon substrate from a side nearer to said surface layer portion, thereby to form a separation layer; the bonding step of bonding said silicon substrate and a second substrate to each other, thereby to form a multilayer structure; and the transfer step of separating said multilayer structure at said separation layer, thereby to transfer at least part of said surface layer portion onto said second substrate.

A multilayer structure according to the present invention is a multilayer structure wherein a first silicon substrate and a second substrate are bonded to each other, the first silicon substrate including therein a separation layer which has been formed by implanting ions of at least one element selected from the group consisting of hydrogen, nitrogen and rare gases; characterized in that said first silicon substrate includes in its surface a surface layer portion which has been formed by hydrogen annealing.

The process of the present invention for peeling off a semiconductor thin film is characterized by comprising the step of preparing a silicon substrate which includes in its surface a surface layer portion subjected to hydrogen annealing; the step of implanting ions of at least one element selected from the group consisting of hydrogen, nitrogen and rare gases, from a side nearer to said surface layer portion, thereby to form a separation layer; and the step of peeling off at least part of said surface layer portion by utilizing said separation layer.

BRIEF DESCRIPTION OF THE DRAWINGS

FIG. 17 is a graph showing the quantities of etching by hydrogen annealing in the cases where silicon and silicon dioxide oppose, in the present invention;

FIG. 18 is a graph showing the number of silicon atoms removed by hydrogen annealing in the cases where silicon and silicon dioxide oppose, in the present invention;

DESCRIPTION OF THE PREFERRED EMBODIMENTS

First, the present invention will be fundamentally described with reference to FIG. 1 which illustrates the flow chart of a process for manufacturing a semiconductor substrate.

A first substrate is prepared which has a surface layer portion subjected to hydrogen annealing, in at least one principal surface thereof (step S1).

Subsequently, the ions of hydrogen or the like are implanted into the first substrate, thereby to form a separation layer at a predetermined position within the first substrate (step S2).

Besides, the first substrate and a second substrate are bonded to each other so that the principal surface may lie inside, thereby to form a multilayer structure (step S3). Thereafter, the multilayer structure is separated by utilizing the separation layer (step S4).

The SOI substrate having a thin film (SOI layer) whose thickness is uniform and in which defects such as OSFs and COPs are in a very small number, can be manufactured via the above steps S1 to S4 and a finishing step S5.

Next, the present invention will be concretely described with reference to FIGS. 2 to 6.

Figure 2:
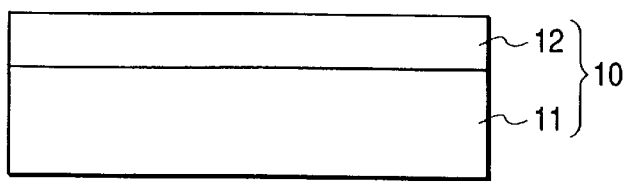
FIGS. 2, 3, 4, 5 and 6 are schematic sectional views showing an example of a process for manufacturing a semiconductor substrate in accordance with the present invention.

A first substrate 10 which has a surface layer portion 12 subjected to hydrogen annealing, in one principal surface thereof, is prepared as shown in FIG. 2. The surface layer portion 12 can be formed in such a way that a bulk wafer serving as a seed is heat-treated in a reducing atmosphere which contains hydrogen (hereinbelow, the heat treatment shall be termed "hydrogen annealing"). The expression "surface layer portion" in the present invention is intended to mean a layer (less-defective layer) in which defects ascribable to the bulk wafer, such as OSFs, COPs and FPDs, are lessened or decreased in number (hereinbelow, the "surface layer portion" shall be also expressed as the "less-defective layer").

Numeral 11 designates a region where the effect of decreasing the defects of the OSFs, COPs etc. by the hydrogen annealing is lower. Of course, the first substrate 10 may well be entirely formed into the less-defective layer 12. Incidentally, although the less-defective layer 12 and the region 11 are illustrated in FIG. 2 so as to change abruptly at a certain boundary, actually they change gradually without any strict boundary. Both surface layers of the first substrate 10 may be less-defective layers.

It is also allowed to perform the succeeding steps after circuit elements such as MOSFETs have been formed in the less-defective layer 12.

Figure 3:
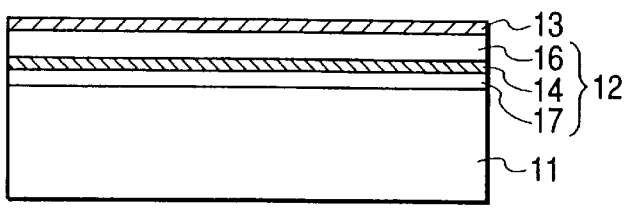

Subsequently, as shown in FIG. 3, the ions of hydrogen or the like are implanted into the first substrate 10, thereby to form a separation layer 14.

The separation layer 14 should desirably be formed within the less-defective layer 12, or at the interface between the region 11 and the less-defective layer 12. In a case where the separation layer 14 has been formed within the less-defective layer 12, this less-defective layer 12 is divided into a layer 16 (hereinbelow, termed "SOI layer") which overlies the separation layer 14, and a layer 17 which underlies it. Alternatively, the separation layer 14 may be formed within the region 11.

It is also allowed to form an insulator layer 13 before or after the ion implantation. The level of a bonding interface can be spaced from the active layer (SOI layer) 16 by the insulator layer 13. In particular, the formation of the insulator layer 13 before the step of the ion implantation is also effective to prevent the surface of the less-defective layer 12 from roughening due to the ion implantation. Especially when the insulator layer 13 is formed by oxidizing the surface of the less-defective layer 12, it can be used as the buried oxide film of an SOI wafer by bonding the resulting first substrate 10 to a second substrate 15 as it is.

Figure 4:
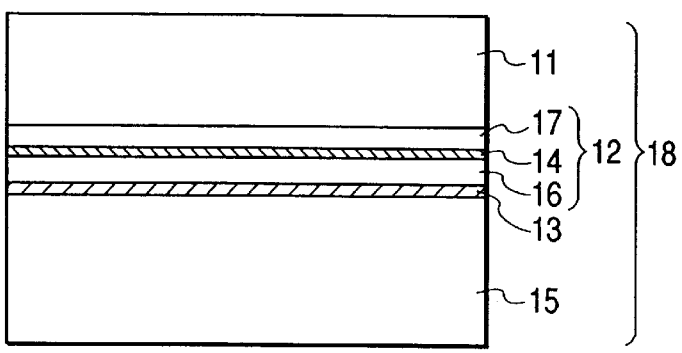

At the next step, the first substrate 10 is bonded with the second substrate 15 so that the less-defective layer 12 may lie inside. Then, a multilayer structure 18 is formed (FIG. 4).

Figure 5:
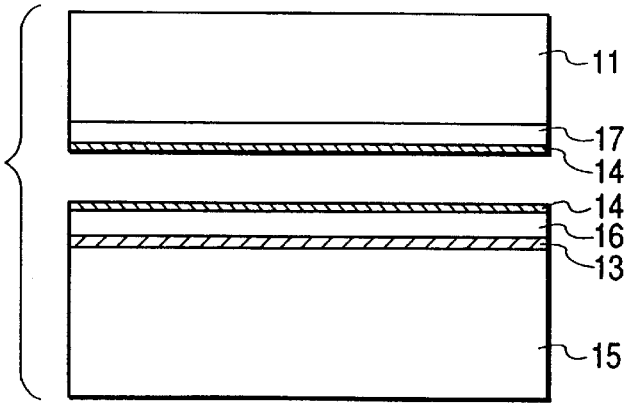

Thereafter, as shown in FIG. 5, the multilayer structure 18 is separated by utilizing the separation layer 14. Herein, the multilayer structure 18 may be separated either within the separation layer 14 or at the interface of the separation layer 14 nearer to the region 11 or to SOI layer 16. Alternatively, the multilayer structure 18 may be separated within the separation layer 14 at a part and at the interface of the separation layer 14 at another part.

Thus, a semiconductor substrate in which the SOI layer 16 is transferred or moved on the second substrate 15 is formed as shown in FIG. 5. Since the SOI layer 16 has been formed on the basis of the less-defective layer 12, it is quite free from, or is much relieved from, the defects of the OSFS, COPs etc. peculiar to the bulk wafer.

In the case where the separation layer 14 has been formed within the region 11, the unnecessary parts of the region 11 etc. are also allowed to remove by polishing, etching with a liquid etchant, or etching based on hydrogen annealing, after the transfer step until the SOI layer 16 (less-defective layer 12) is exposed.

According to the present invention, especially when the separation layer 14 has been formed within the less-defective layer 12, the implanted ions are less scattered by the defects of the OSFs, COPs etc. at the step of the separation. It is accordingly permitted to form the separation layer 14 whose thickness is more uniform than in the case of forming the separation layer in the region where the defects of the COPs are large in number. In other words, it is permitted to enhance uniformity in the thickness of the SOI layer 16.

Figure 6:
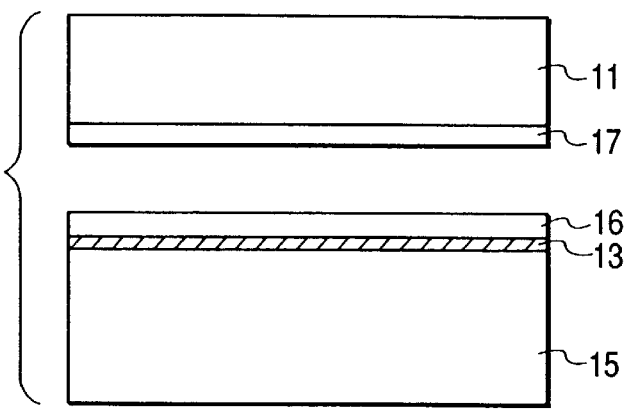

Besides, in a case where part of the separation layer 14 and/or part of the region 11 remains on the SOI layer 16 after the separation, they (it) are (is) removed, whereby the semiconductor substrate intended by the present invention is finished up (FIG. 6).

Incidentally, the first substrate 10 (particularly the region 11) obtained after the separation can be reused for the process for manufacturing the semiconductor substrate as stated above. In this case, when part of the separation layer 14 remains on the region 11, it is removed, and when the surface of the first substrate 10 is too rough to be allowable, it is subjected to a flattening treatment. Thereafter, the resulting first substrate 10 can be utilized as the new first substrate again. Of course, it can also be utilized as the second substrate 15.

When the less-defective layer 12 is formed thicker beforehand, it can be resupplied without performing the hydrogen annealing in the next reuse of the first substrate 10.

Now, the individual constituents and steps of the semiconductor substrate according to the present invention will be described in detail.

(First Substrate)

A bulk silicon wafer, especially a CZ silicon wafer, is used as the starting material of a first substrate 10. It is suitable to employ the first substrate 10 having a surface layer portion 12 in which the defects of COPs (Crystal Originated Particles) etc. are lessened in number by subjecting the raw material wafer to hydrogen annealing.

The "CZ silicon wafer" is a silicon substrate which is manufactured by the pulling method (Czochralski method). The CZ wafer involves large numbers of defects peculiar to the bulk wafer, such as OSFs (Oxidation Induced Stacking Faults), COPs, and FPDs (Flow Pattern Defects).

Here, the "OSFs" are such that minute defects introduced in the growth of a crystal wafer so as to serve as the nucleus thereof are actualized by an oxidation process. By way of example, the OSFs of ring shape are sometimes observed when a wafer surface is subjected to wet oxidation.

On the other hand, the "COPs" and "FDPs" which can be observed without performing any heat treatment are considered defects (grown-in defects) ascribable to the same cause, and they are not strictly defined and distinguished. Roughly speaking, however, the former defects "COPs" signify etch pits which can be detected with a fine-grain detector or a foreign-matter inspection device based on light scattering, after the wafer has been immersed in the SC-1(NH$_4$OH/ H$_2$O$_2$) solution being one of the constituent liquids of the RCA washing liquid. The latter defects "FDPs" signify etch pits which are observed with an optical microscope after the wafer has been immersed in the Secco solution (K$_2$Cr$_2$O$_7$/ HF/H$_2$O) for about 30 minutes.

Incidentally, the causes of the defects such as the OSFs, COPs and FPDs have not been exactly clarified yet. It has been reported, however, that all the defects correlate intensely with the concentration of oxygen contained in the wafer, and that the defects of the OSFs etc. are liable to arise when the oxygen concentration is high (in, for example, "Problems of Silicon Crystal and Wafer Technology" issued by Realize Inc., p. 55).

Next, the less-defective layer 12 which is formed by the hydrogen annealing will be explained.

Usually, the CZ silicon wafer contains oxygen in the order of $10^{18}$ atoms/cm$^3$. When the wafer is subjected to the hydrogen annealing, the oxygen contained in this wafer is out-diffused to lower the oxygen concentrations of a wafer surface and the vicinity thereof.

Owing to the lowering of the oxygen concentrations, the surface layer portion of the wafer is reformed more, so that the less-defective layer 12 in which the defects of the COPs, OSFs etc. are lessened in number can be formed. By way of example, the OSFs appear in such a manner that oxygen atoms gather to a precipitation nucleus and incur oxygen precipitation, whereupon the defects (stacking faults) grow with the precipitation nucleus as a point of origin.

Besides, the COPs exist at a density of $10^5$ to $10^7$/cm$^3$ in the CZ silicon wafer. In case of a CZ wafer of, for example, 8 inches, COPs in the order of 400 to 500 particles per unit wafer exist in the vicinity of the surface of the wafer. However, when the CZ silicon wafer is subjected to the hydrogen annealing, the number of the COPs suddenly decreases down to about 10 in the vicinity of the surface. That is, a layer (DZ layer; Denuded Zone layer) which is substantially defectless is formed. Incidentally, the "number per unit wafer" in the present invention signifies the "number of the defects such as COPs per surface area occupied by one wafer". By way of example, in the case of the 8-inch wafer, the "number per unit wafer" is the number of the COPs relative to approximately 324 cm$^2$.

In this manner, when the CZ silicon wafer subjected to the hydrogen annealing is employed, the defects of the COPs etc. existent in an SOI layer 16 which is to be transferred onto a second substrate 15 can be nullified or decreased, and uniformity in the thickness of the SOI layer 16 can be enhanced.

The thickness of the less-defective layer 12 which is formed by the hydrogen annealing should preferably be in the order of 500 to 5000 nm though it depends also upon the thickness of the SOI layer 16 which is to be transferred onto the second substrate 15.

The concentration of oxygen in the less-defective layer 12 should be $5 \times 10^{17}$ atoms/cm$^3$ or below, it should preferably be $1 \times 10^{17}$ atoms/cm$^3$ or below, and it should more preferably be $5 \times 10^{16}$ atoms/cm$^3$ or below.

Further, it is desirable that the concentration of oxygen in a separation layer 14 which is formed by implanting ions is included in the range specified above.

The density of COPs per unit volume in the less-defective layer 12 should lie from 0 particle/cm$^3$ to $5 \times 10^6$ particles/cm$^3$ or below, it should preferably lie from 0 particle/cm$^3$ to $1 \times 10^6$ particles/cm$^3$ or below, and it should more preferably lie from 0 particle/cm$^3$ to $1 \times 10^5$ particles/cm$^3$ or below. It is especially desirable that the density of COPs in a depthwise region extending from the outermost surface of the surface layer portion 12 to the projection range of the ion implantation lies within the values specified above.

Besides, in the case of the 8-inch wafer, the number of COPs per unit wafer in the less-defective layer 12 should lie from 0 to 500 or below, it should preferably lie from 0 to 100 or below, it should more preferably lie from 0 to 50 or below, and it should still more preferably lie from 0 to 10 or below. Incidentally, the distribution of the COPs in the surface of the wafer is such that the COPs have an intense tendency to concentrate in the vicinity of the center of the wafer extending within about 6 cm from the center. It is therefore desired that the number of COPs per unit wafer is substantially equal to the value in the 8-inch wafer, even in a 12-inch wafer or a larger wafer.

In addition, the number of COPs per unit area in the wafer surface should lie from $0/cm^2$ to $1.6/cm^2$ or below, it should preferably lie from $0/cm^2$ to $0.5/cm^2$ or below, and it should more preferably lie from $0/cm^2$ to $0.05/cm^2$ or below.

Further, it is desirable that the density of COPs per unit volume (or per unit area) in the separation layer 14 falls within the above range.

Also, the number of FPDs per unit area in the less-defective layer 12 should lie from $0/cm^2$ to $5\times10^2/cm^2$ or below, and it should preferably lie from $0/cm^2$ to $1\times10^2/cm^2$ or below.

Besides, in case of specifying the less-defective layer 12 in terms of OSFs, the density of the OSFs per unit area should lie from 0 fault/cm$^2$ to 100 faults/cm$^2$ or below, it should preferably lie from 0 fault/cm$^2$ to 50 faults/cm$^2$ or below, and it should more preferably lie from 0 fault/cm$^2$ to 10 faults/cm$^2$ or below.

The less-defective layer 12 is formed by heat-treating the raw material of the first substrate 10 in a reducing atmosphere which contains hydrogen. The atmosphere may be hydrogen gas, or a mixed gas consisting of hydrogen and a rare gas (such as Ar, He, Ne, Xe, Kr).

A temperature for the hydrogen annealing should lie from 500° C. to below the fusion point of the material of the first substrate 10, it should preferably lie from 800° C. to below the fusion point of the material of the first substrate 10, and it should more preferably lie from 1000° C. to below the fusion point of the material of the first substrate 10.

In a case where the first substrate 10 is a silicon substrate (the fusion point of silicon is about 1412° C.), the annealing temperature should preferably lie from 800° C. to 1350° C. in consideration of the diffusion rate of oxygen and a burden on a heat-treating furnace. It should more preferably lie from 900° C. to 1250° C.

The pressure of the hydrogen containing atmosphere for the hydrogen annealing may be any of the atmospheric pressure, a reduced pressure and a raised pressure. It is suitable to perform the hydrogen annealing under the atmospheric pressure, or under a pressure between the atmospheric pressure ($1\times10^5$ Pa) and $1\times10^4$ Pa. It is more suitable to perform the hydrogen annealing under a slightly reduced pressure which is about 100 mmH$_2$O lower than the atmospheric pressure. In particular, when the hydrogen annealing is performed under a reduced pressure, the defects of the COPs etc. can be lessened more effectively on the basis of the out-diffusion of oxygen etc. though the lessening effect depends also upon the construction of the heat-treating furnace.

The furnace for the hydrogen annealing may be a vertical type heat-treating furnace or horizontal type heat-treating furnace which is ordinarily used. A heater which can be employed is any of a resistance heater, a radio-frequency heater, etc.

Alternatively, the hydrogen annealing can be performed by lamp heating which utilizes thermal radiation and which is employed for RTA (Rapid Thermal Annealing). A rapid annealing device in this case may be, for example, an infrared annealing device based on a halogen lamp, an arc lamp or the like, or a flash-lamp annealing device based on a xenon flash lamp or the like. Especially in the case of the lamp heating, the hydrogen annealing is possible in a short time.

A time period required for the hydrogen annealing should be between several seconds and several tens hours, and should preferably be between several seconds and several hours.

By the way, in the case where the less-defective layer 12 has been formed by subjecting the CZ silicon wafer to the hydrogen annealing, the number of defects (for example, COPs) per unit wafer as to the less-defective layer 12 shown in FIG. 2 is the smallest at the outer surface thereof, and it enlarges more at the deeper part of the wafer. In case of manufacturing an SOI substrate by the bonding technique (adhesion method), the number of the COPs in the SOI layer 16 shown in FIG. 6 is the smallest at the interface between this SOI layer 16 and an insulator layer 13 and is the largest at the outermost surface of this SOI layer 16.

It is accordingly favorable for further lessening the number of COPs at the outermost surface of the SOI layer 16 that hydrogen annealing is performed also after the exposure of the SOI layer 16 succeeding the step of separation. In this case, the SOI layer 16 both the surfaces of which have been subjected to the hydrogen annealing can be obtained. Particularly, in a case where the less-defective layer 12 has been formed by subjecting the CZ silicon wafer to the hydrogen annealing for a time period of several seconds to three hours or so, it is more desirable to perform the hydrogen annealing for both the surfaces of the less-defective layer 12.

In addition, the material of the first substrate 10 to undergo the hydrogen annealing is not restricted to the CZ silicon wafer, but a silicon wafer manufactured by the MCZ method (Magnetic Field Applied Czochralski Method), hereinbelow termed the "MCZ silicon wafer", is also employed favorably. It has been reported that, when compared with the CZ silicon wafer, the MCZ silicon wafer suppresses increase in the sizes of COPs contained in silicon ("Electronic Materials", June Issue (1998), p. 22). When subjected to the hydrogen annealing, the MCZ silicon wafer can be formed with a less-defective layer 12 of higher quality than in the CZ silicon wafer.

Besides, in the case of using silicon for the first substrate 10, it is possible to employ a p-type or n-type CZ wafer whose resistivity is 0.1 to 100 Ω·cm, more appropriately 0.5 to 50 Ω·cm.

Considering that an impurity element such as boron or phosphorus is out-diffused from within the silicon by the hydrogen annealing, the CZ silicon wafer being the substrate to undergo the hydrogen annealing may well have a resistivity lower than the above resistivity. The less-defective layer 12 itself, however, should preferably exhibit the p-type or n-type with the resistivity of 0.1 to 100 Ω·cm, more appropriately 0.5 to 50 Ω·cm.

Of course, if the desired SOI layer 16 is obtained, a wafer of undesignated concentration or a wafer to be reused can also be employed. In a case where a resistivity outside the above range is required for the specifications of the SOI layer of an SOI wafer, it is favorable to employ the wafer of the resistivity conforming to the specifications.

Further, the material of the first substrate 10 is not restricted to the CZ or MCZ single-crystal silicon substrate, but it may well be any of a Ge substrate, an SiC substrate, an SiGe substrate, a GaAs substrate, an InP substrate, etc.

Moreover, in the case where the material of the first substrate 10 is the silicon substrate, a silicon oxide layer can be employed as the insulator layer 13 by oxidizing the surface of the substrate. The insulator layer 13 may well be realized in such a way that a silicon nitride layer is formed by nitriding the substrate surface, or that a silicon oxide film or a silicon nitride film is deposited on the less-defective layer 12 by CVD (Chemical Vapor Deposition).

The thickness of the insulator layer 13 should preferably be several nm to several $\mu$m or so.

Of course, it is also allowed to omit the formation of the insulator layer 13 on the first substrate 10 or to form insulator layers 13 on both the first substrate 10 and the second substrate 15 beforehand.

(Ion Implantation)

Regarding the element of ion implantation for the formation of a separation layer 14, it is possible to implant the ions of hydrogen or a rare gas such as helium, neon, krypton or xenon, or the ions of nitrogen solely or in combination with any of the preceding elements. Even with an identical element, ions of different masses such as $H^+$ and $H_2^+$ may be implanted, whereby the separation of a multilayer structure 18 can be facilitated. The step of the ion implantation is not restricted to a case where the ions of the same element are implanted once, or a plurality of number of times so as to have an identical projection range. It is also favorable to contrive and form the separation layer 14 by changing the ion species of the plantation, the energy thereof, the dose thereof, etc. in stages. In particular, it is favorable to form the separation layer 14 so as to have a lower or higher mechanical strength as it comes nearer to an SOI layer 16 which is to be transferred onto a second substrate 15 being a supporting substrate, whereby the step of separation is performed as desired. In general, as the dose of implantation is larger, microbubbles increase more, and the mechanical strength of an implanted region becomes lower.

The ion implantation can be performed by setting an acceleration voltage within a range of 1 keV to 10 MeV inclusive. Since the thickness of the implanted layer 14 varies depending upon the acceleration voltage, this voltage should preferably be set on the order of several tens keV to 500 keV so as to fulfill a desired condition.

Anyway, it is important to perform the ion implantation so that the multilayer structure 18 may be easily separated at the resulting separation layer 14.

In the present invention, it is favorable also for attaining a uniform implantation depth to perform the ion implantation so that the projection range $R_p$ (implantation depth) of the ion implantation may lie within a less-defective layer 12. The thickness of the SOI layer 16 is ordinarily several nm to 5 $\mu$m.

The thickness of the separation layer 14 which is formed by the ion implantation is ordinarily 0.5 micron or below. In particular, it should more preferably be several thousand Å or below in order to form at a uniform thickness the thin film 12 which is to be transferred onto the second substrate 15. The separation layer 14 includes the projection range of the ion implantation by way of example.

The dose of the implantation can be set at $1.0 \times 10^{15}/cm^2$ to $1.0 \times 10^{18}/cm^2$, and more preferably at $1.0 \times 10^{16}/cm^2$ to $2.0 \times 10^{17}/cm^2$.

The temperature of the ion implantation should preferably lie between $-200°$ C. and $600°$ C., more preferably at or below $500°$ C., and still more preferably at or below $400°$ C. The reason therefor is that, when the temperature exceeds about $500°$ C., the implanted ions having gathered near the projection range is rapidly diffused to be emitted from a first substrate 10, so the separation layer (microbubble layer) 14 fails to be formed.

Another process for forming the separation layer 14 is the plasma ion implantation in which hydrogen ions, for example, are caused to permeate into a desired region by utilizing a plasma. Owing to the plasma, the ion-implanted layer (separation layer 14) can be formed in a shorter time and at a more uniform thickness than in the case of the conventional ion implantation.

(Bonding)

Mentioned as the sorts of a second substrate 15 to be bonded with a first substrate 10 are a single-crystal silicon substrate, a polycrystalline silicon substrate, an amorphous silicon substrate, a sapphire substrate, a light transmitting substrate such as quartz substrate or glass substrate, a metal substrate of Al or the like, a ceramics substrate of alumina or the like, and a compound semiconductor substrate of GaAs, InP or the like. The sorts of the second substrate 15 are properly selected according to the intended use of the final product including an SOI layer 16. The first substrate 10 can also be bonded to a substrate of plastics or the like if the latter substrate has an appropriate flatness.

It is also favorable to form an insulator layer on the bonding surface of the second substrate 15 beforehand. In bonding the first and second substrates, an insulating sheet may well be sandwiched therebetween to form a triple stacked structure. When the light transmitting substrate is employed as the second substrate 15, a contact sensor being a photosensor or a liquid-crystal image display panel of projection type can be constructed. Herein, driving elements whose performances are high enough to heighten the pixel density, resolution and definition of the sensor or the display panel can be fabricated.

A multilayer structure 18 is formed by bonding the first substrate 10 and the second substrate 15 at a room temperature.

In a case where, before being stacked at the room temperature, the first and second substrates have their surfaces activated by a nitrogen or oxygen plasma and are washed with water and then dried, the heat treatment of the next step for raising a bonding strength can have its temperature made lower.

In a case where the first substrate 10 and the second substrate 15 are to be brought into close adhesion by heightening the bonding strength, it is also favorable to perform the heat treatment (hereinbelow, termed the "first heat treatment") midway of or after the bonding. It is desired that the first heat treatment is a low-temperature heat treatment which is performed at a temperature of room temperature to $500°$ C., more preferably room temperature to $400°$ C.

It is also favorable to bond the first and second substrates by pressing the multilayer structure 18 or by anodic welding, with or without the first heat treatment.

Regarding an atmosphere for the bonding operation, the first and second substrates may be brought into touch in any of the atmospheric air, oxygen, nitrogen, vacuum, etc.

The atmosphere of the first heat treatment may be $N_2$, $O_2$, an oxidizing atmosphere, or the combination thereof.

By the way, the first substrate 10 can also be once bonded to another substrate and thereafter bonded to a desired supporting substrate, without being directly bonded with the second substrate 15 which serves as a supporting substrate.

(Separation)

A multilayer structure 18 can be separated or divided by a heat treatment. Concretely, the heat treatment is performed at a temperature of 400° C. to 1350° C., more preferably 400° C. to 1000° C., and still more preferably 400° C. to 600° C.

When the heat treatment as stated above is performed, a separation layer 14 is internally pressurized by the rearrangement of a crystal and the coalescence of microbubbles within the separation layer 14, and a thin film which is a part or the entirety of a less-defective layer 12 is peeled off.

It is also possible to separate the multilayer structure 18 by utilizing the speeded-up oxidation of the separation layer 14.

More specifically, the ion-implanted layer (separation layer 14) is oxidized from the periphery of the multilayer structure 18. Thus, the volumetric expansion of the ion-implanted layer enlarges more at a position nearer to the outer periphery thereof, as if a wedge were entered into the ion-implanted layer uniformly from the outer periphery. Accordingly, only the ion-implanted layer undergoes an internal pressure, and the multilayer structure 18 is divided within the ion-implanted layer or at the interface thereof over the whole wafer.

Incidentally, the ion-implanted layer is usually covered with a non-porous layer even at the outer peripheral part thereof. In this regard, it is also favorable to expose the outer peripheral part or end face of the ion-implanted layer after or before bonding a first substrate 10 and a second substrate 15 into the multilayer structure 18. When such a multilayer structure 18 is oxidized, the speeded-up oxidation starts from the outer peripheral part of the ion-implanted layer because of the very large surface area of this ion-implanted layer.

When Si turns into $SiO_2$, its volume expands 2.27 times. Under the condition of a porosity of 56% or below, therefore, also the oxidized ion-implanted layer exhibits a volumetric expansion. Since the degree of the oxidation lowers toward the center of the wafer, the volumetric expansion of the oxidized ion-implanted layer becomes larger at the outer peripheral part of the wafer. Such a phenomenon presents the same situation as in the case of entering the wedge from the end face of the wafer into the ion-implanted layer. Thus, only the ion-implanted layer undergoes the internal pressure, and the multilayer structure 18 undergoes a force so as to be divided within the ion-implanted layer. Moreover, the oxidation proceeds uniformly at the peripheral edge of the wafer, so that the multilayer structure 18 is peeled off equally from the outer periphery of the wafer.

According to the present invention, the speeded-up oxidizability of the ion-implanted porous layer, the volumetric expansion thereof and the fragility thereof are combined by utilizing the oxidation being one step of a conventional Si-IC process as has an excellent homogeneity. Therefore, the internal pressure can be exerted on only the ion-implanted porous layer, whereby the wafer can be divided within the ion-implanted porous layer at a good controllability.

Alternatively, a bonded substrate body (stacked substrates) can be separated at the fragile ion-implanted porous layer in such a way that a thermal stress is generated by heating the whole bonded substrate body, by utilizing the facts that the bonded wafers are multilayered in construction and that the ion-implanted porous material is structurally fragile. The heating in this case can be performed by, for example, a heat treatment at a temperature of 1150° C. and for a time period of 30 seconds.

In the present invention, the multilayer structure 18 can also be separated through the ion-implanted porous layer by a thermal stress, softening or the like resulting when the ion-implanted porous material solely or this material as well as the vicinity thereof has been heated, by utilizing the fact that the ion-implanted porous material is structurally fragile.

Especially when a laser is used, only a certain specified layer can be heated by allowing it to absorb energy, without heating the whole bonded substrate body. Herein, local heating can be performed by employing the laser of a wavelength which is absorbed by only the ion-implanted porous layer or a layer vicinal to the ion-implanted porous material. Usable as the laser is, for example, a $CO_2$ laser which has an output power of 500 to 1000 W or so.

The porous layer can be rapidly heated in such a way that an electric current is caused to flow through the ion-implanted porous layer or within the wafer surface vicinal to the ion-implanted porous material. It can also be heated by causing a pulsating current to flow.

It is also favorable to utilize a jet stream of high water pressure or the like as an expedient for separating the multilayer structure 18.

The so-called "water jet method" in which a water stream under a high pressure is injected from a nozzle may well be employed for separating the multilayer structure 18 at the ion-implanted layer (separation layer 14).

Apart from water, it is possible to use a liquid which functions to selectively etch the separation region, and which is exemplified by an organic solvent such as alcohol, an acid such as fluoric acid or nitric acid, or an alkali such as potassium hydroxide. Further, a gas such as air, nitrogen gas, carbonic acid gas or rare gas may well be employed as a fluid. Alternatively, a fluid of low temperature or a liquid of extremely low temperature may well be employed.

It is also allowed to employ an electron beam, or a gas or plasma which has an etching action on the separation region.

The separation region can be removed from its side surface by injecting or spraying the water jet to this separation region in conformity with a bonding seam on the side surface of the multilayer structure 18. In this case, first of all, the water jet is directly injected against the separation region exposed to the side surface of the bonded substrate body and against the nearby parts of first and second substrate body members. Then, only the fragile separation region is removed by the water jet without damaging the individual substrate body members, until the two substrate body members are detached. Even in a case where the separation region is not exposed beforehand and is covered with a thin layer by any reason, the water jet may be injected to initially remove the layer covering the separation region and to continually remove the exposed separation region. In addition, the bonded wafers can be separated by widening and destroying the structurally-fragile separation region in such a way that the water jet is injected into the narrow gap of the bonded wafers on the peripheral side surface of the bonded substrate body, though this effect has not hitherto been often utilized. Since, in this case, cutting or removal is not intended, the cutting debris of the separation region is hardly produced. Moreover, even when the material of the separation region cannot be removed by the water jet itself, the bonded wafers can be separated without using a polishing material and without damaging the surface of the separation. In this manner, the effect can be considered a kind of wedge effect based on the fluid, unlike a cutting or polishing effect. Accordingly, the effect is greatly expectable in a case where the narrow gap being concave exists on the side surface of the bonded substrate body, and where a force is exerted in the direction of peeling off the separation region, by injecting the water jet. If the effect is to be satisfactorily demonstrated, the shape of the side surface of the bonded substrate body should preferably be concave, not convex.

By the way, in the case of the separation with the jet stream, the temperature of the multilayer structure 18 is set within a range of −200° C. to 450° C. inclusive. Preferably, it is set within a range of room temperature to 350° C.

Besides, for the separation of the multilayer structure 18, the separation layer can be destroyed by any of the following methods:

Sufficient tensile forces or pressures are uniformly applied to the bonded wafers normally and within the planes thereof.

The wave energy of ultrasonic waves is applied.

An appliance like the edge of a razor (for example, a wedge made of Teflon resin) is inserted into the separation layer at the wafer end face (the periphery of the bonded wafers).

The separation layer is exposed to the wafer end face, the porous Si is etched to some extent, and an appliance like the edge of a razor is inserted into the resulting separation layer.

The porous layer is exposed to the wafer end face, the porous Si is impregnated with a liquid such as water, and the whole bonded wafers are thereafter heated or cooled to expand the liquid.

A force (shearing force or rotating force) is horizontally applied to the second (or first) substrate relatively to the first (or second) substrate.

Also, only the ion-implanted layer (separation layer 14) can be selectively divided by electroless wet chemical etching in such a way that the multilayer structure 18 is immersed in fluoric acid or a mixed solution in which at least either of alcohol and hydrogen peroxide is added to fluoric acid, or in buffered fluoric acid or a mixed solution in which at least either of alcohol and hydrogen peroxide is added to buffered fluoric acid.

(Removal of Remains on Second Substrate)

In a case where a separation layer 14 remains on an SOI layer 16 when a multilayer structure 18 has been separated by utilizing the separation layer 14, the step of removing the remains is preferable. Of course, the step of removal is unnecessary in a case where the separation at the separation layer 14 occurs at the interface of the separation layer 14 with the SOI layer 16.

It is also favorable for the removal of the remains to execute polishing or grinding, particularly chemical mechanical polishing (CMP). Usable as a polishing agent on that occasion is any of the polishing grits of borosilicate glass, titanium dioxide, titanium nitride, aluminum oxide, iron nitrate, cerium oxide, colloidal silica, silicon nitride, silicon carbide, graphite, diamond, etc., or grinding grit liquids in which the above grinding grits are mixed with the oxidizing agent of $H_2O_2$, $KIO_3$ or the like or the alkaline solution of NaOH, KOH or the like.

The removal of the separation layer 14 in the present invention can also be effected by selective polishing with a single-crystal layer as a polishing stopper, for the reason that the separation layer 14 has a low mechanical strength and a very large surface area.

It is also favorable to remove the remains of the separation layer 14 by etching.

Herein, a fluoric or nitric acid system, an ethylene diamine system, a KOH system or a hydrazine system is usable as an etchant. Also usable is hydrofluoric acid or a mixed solution in which at least either of hydrogen peroxide and alcohol is added to fluoric acid, or buffered fluoric acid or a mixed solution in which at least either of hydrogen peroxide and alcohol is added to buffered fluoric acid. Thus a solution containing hydrogen fluoride can be used.

In a case where the remains of the separation layer 14 are thin, or a case where the multilayer structure 18 is separated substantially at the interface between the SOI layer 16 and the separation layer 14, the surface of the SOI layer 16 can be smoothened by carrying out hydrogen annealing after the separation.

The hydrogen annealing is done by a heat treatment in a reducing atmosphere which contains hydrogen. The atmosphere may be hydrogen gas, or a mixed gas consisting of hydrogen and a rare gas (such as Ar).

A temperature for the hydrogen annealing should lie between 800° C. and 1350° C. inclusive, and more preferably between 850° and 1250° C. inclusive.

The pressure of the hydrogen containing atmosphere for the hydrogen annealing may be either of the atmospheric pressure and a reduced pressure. It is suitable to perform the hydrogen annealing under the atmospheric pressure, or under a pressure between the atmospheric pressure ($1 \times 10^5$ Pa) and $1 \times 10^4$ Pa inclusive. It is more suitable to perform the hydrogen annealing under a slightly reduced pressure which is about 100 mmH$_2$O lower than the atmospheric pressure.

In the case where the remains of the separation layer 14 are removed by the hydrogen annealing, the separation layer 14 should desirably be held in opposition to silicon oxide.

More specifically, when the remains are heat-treated in opposition to the silicon oxide, this silicon oxide and silicon constituting the separation layer 14 react through the atmosphere as follows:

$$Si + SiO_2 \rightarrow 2SiO$$

It is therefore possible to efficiently remove the ion-implanted remaining layer. Moreover, the migration of Si simultaneously proceeds so as to lower surface energy, with the result that the surface of the SOI layer 16 is smoothened.

Thus, the single-crystal silicon film can have its surface flattened equally to a single-crystal wafer and have its thickness decreased under control, without incurring the crystal defects of processing distortions etc. as are incurred by the polishing of a single-crystal silicon film formed on the surface of a semiconductor substrate material. That is, smoothening the surfaces of an SOI substrate etc., decreasing a boron concentration, and etching silicon can be performed at the same time without spoiling the uniformities of film thicknesses in each wafer and between the wafers.

It is also favorable to perform the hydrogen annealing after the separation layer 14 has been removed to some extent or entirely by the polishing or etching.

By the way, in a case where a separation layer is formed within a region 11 by ion implantation, a part of the region 11 is removed together with the remaining separation layer 14 by the use of the above method.

(Removal of Remains on First Substrate)

When a separation layer 14 partly remains on a part of a first substrate obtained after the separation of a multilayer structure 18 (for example, on a region 11 as well as a less-defective layer 17 in a case where the separation layer 14 has been formed within a less-defective layer 12), the remains are removed by the foregoing method such as polishing, grinding or etching, followed by a surface flattening treatment for any unsatisfactory surface flatness, whereby the first substrate can be reused as a new first substrate or a succeeding second substrate again. Although the surface flattening treatment may well be performed by a method such as polishing or etching which is usually used in a semiconductor process, it can also be done by a heat treatment in a reducing atmosphere containing hydrogen. In accordance with selected conditions, the heat treatment can flatten the surface of the substrate to the extent that an atomic step is exposed locally.

Particularly in the case where the separation layer 14 has been formed within the less-defective layer 12, the less-defective layer 17 is borne on the region 11 even after the separation. Therefore, the series of steps of a process for manufacturing an SOI substrate can be carried out after forming a separation layer 14 within the less-defective layer 17 again.

In a case where an SOI substrate is manufactured by employing the bonding or adhesion method, the single SOI substrate is manufactured from two wafers. Herein, it is permitted to manufacture the SOI substrate more economically, by reusing the first substrate obtained after the separation.

(Annealing after Separation)

In the present invention, it is also preferable to perform a heat treatment (hereinbelow, termed the "second heat treatment") after a multilayer structure 18 has been separated by utilizing a separation layer 14, for the purpose of heightening the adhesion or bonding strength between a supporting substrate (second substrate 15) and an SOI layer 16 arranged thereon.

The temperature of the second heat treatment is set higher than that of the first heat treatment explained before (lower-temperature heat treatment which is performed midway of bonding or immediately after the bonding). Concretely, the temperature of the second heat treatment should lie between 600° C. and 1350° C. inclusive, and more preferably between 800° C. and 1200° C. inclusive.

In a process after the microbubble layer (separation layer 14) has been formed within bulk silicon by the ion implantation of hydrogen or the like, it is desired to perform no heat treatment or to perform a heat treatment at a lower temperature, except for the case of separation by a heat treatment. The reason therefor is that the coalescence of microbubbles occurs at a temperature exceeding about 500° C., so separation not originally intended might take place. It is accordingly favorable to perform the lower-temperature heat treatment (first heat treatment) at or below 500° C. in the case where the adhesion strength is heightened after the bonding.

After the multilayer structure 18 has been separated by any desired method, the second heat treatment the temperature (for example, about 900° C.) of which is higher than that of the first heat treatment should be performed to heighten the close adhesion strength between the SOI layer 16 and the second substrate 15 and to stabilize the bonding interface of the resulting SOI substrate.

When, in this manner, the heat treatment (second heat treatment) at the higher temperature of at least 800° C. and 1350° C. is performed after the lower-temperature heat treatment (first heat treatment) at or below 500° C., the precipitation phenomenon of oxygen is sometimes accelerated to increase the defects of OSFs dependent upon the precipitation density of oxygen ("Silicon" written by Takao Abe, p. 194, issued by Baifukan Kabushiki-Kaisha). In the present invention, however, the concentration of oxygen in a less-defective layer 12 is sufficiently low, and hence, the increase of the defects attributed to the higher-temperature heat treatment succeeding the lower-temperature heat treatment is preventable.

After all, according to the present invention, the surface layer of a wafer heat-treated in an atmosphere containing hydrogen can be detached and transferred onto another substrate by utilizing an ion-implanted layer. Since defects (COPs, Grow-in defects, etc.) inherent in the bulk Si of a layer close to the principal surface of the wafer can be excluded by the heat treatment, the available percentage of a device can be enhanced.

By way of example, in the manufacturing process of a 16M (megabyte) DRAM (Dynamic Random Access Memory) which is produced with a sufficient margin with respect to the sizes of the COPs, the presence of the COPs is not considerably problematic. However, when the 16M DRAM has shifted to a 64M DRAM, the elements of the device are designed with sizes being nearly equal to those of the COPs, and hence, the available percentage of the device will lower drastically due to the COPS. The present invention is very effective in point of capable of providing an SOI substrate in which an SOI layer 16 involves a very small number of COPs.

The wafer which has been heat-treated in the atmosphere containing hydrogen, is deemed to be meritorious in cost and excellent in mass-productivity and is expected to replace a wafer furnished with an epitaxial film. It is said that, in the future, the diameter of a wafer will enlarge more to render the pulling-up of a high-quality crystal difficult. Further, the bulk wafer might degrade. For these reasons, it is very useful to manufacture the SOI substrate by utilizing the wafer which includes a less-defective layer heat-treated in the atmosphere containing hydrogen.

Next, it will be explained that, in case of removing a separation layer 14 by a process which includes hydrogen annealing, effects based on the hydrogen annealing differ depending upon materials which oppose to substrates to-be-processed in a heat-treating furnace, and upon the distances between the substrates to-be-processed and surfaces opposing thereto.

The surface (SOI layer) of the substrate to-be-processed is sometimes etched by the hydrogen annealing (heat treatment in a reducing atmosphere containing hydrogen), and the quantity of the etching differs in accordance with the material which opposes to the surface of the SOI layer. This fact will be concretely explained below.

Figure 15:
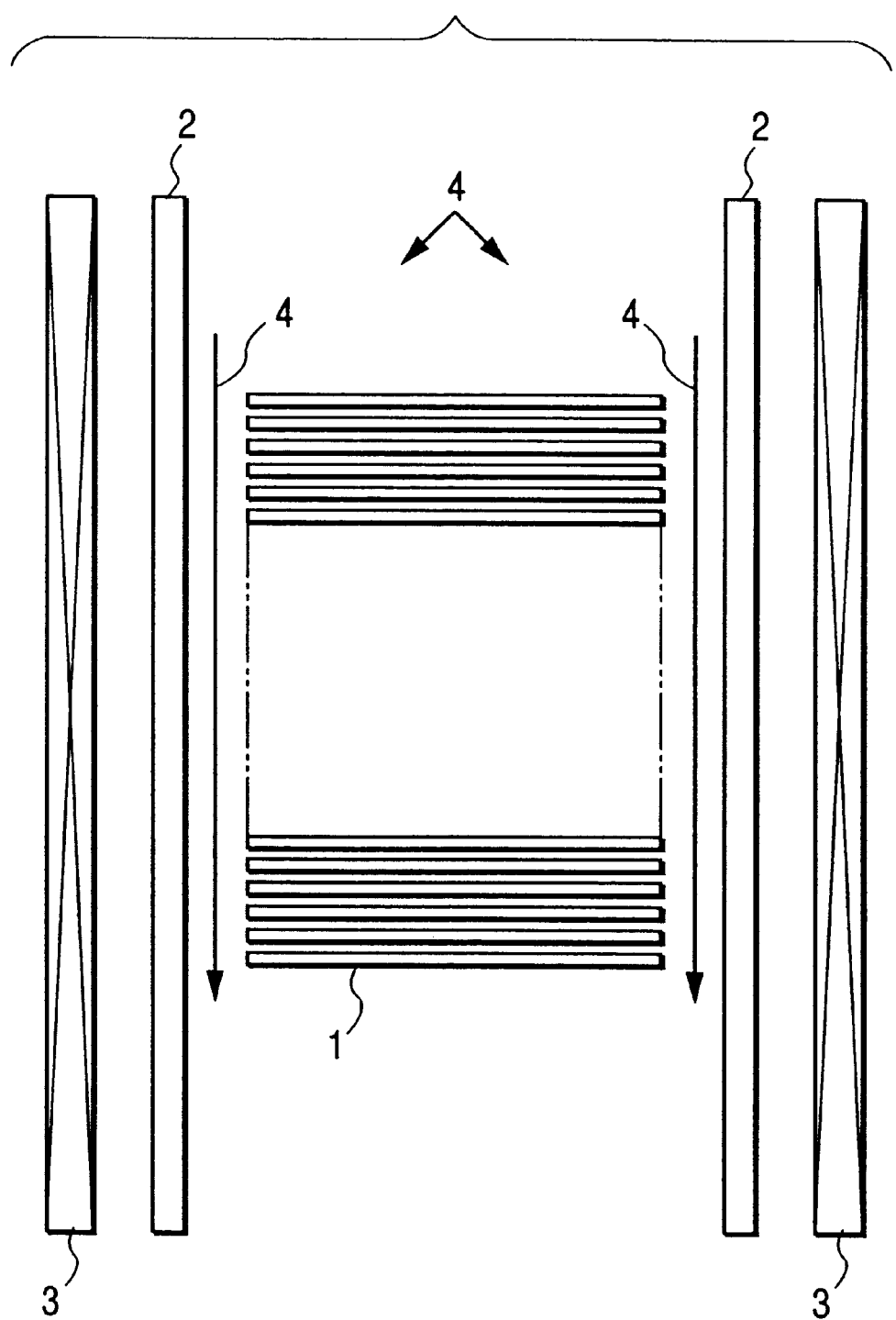
FIG. 15 is a schematic sectional view showing a situation where hydrogen annealing is carried out by the use of a vertical type batch furnace for heat-treating wafers, in the present invention.

In a vertical type batch furnace for heat-treating wafers as shown in FIG. 15, the etching rate of each single-crystal silicon layer (SOI layer) changes greatly in accordance with the material of a surface (opposing surface) opposing to the surface of the single-crystal silicon layer. In FIG. 15, numeral 1 designates a plurality of wafers, numeral 2 a core tube made of quartz, numeral 3 a heater, and numeral 4 the streams of a processing gas.

Figure 16:
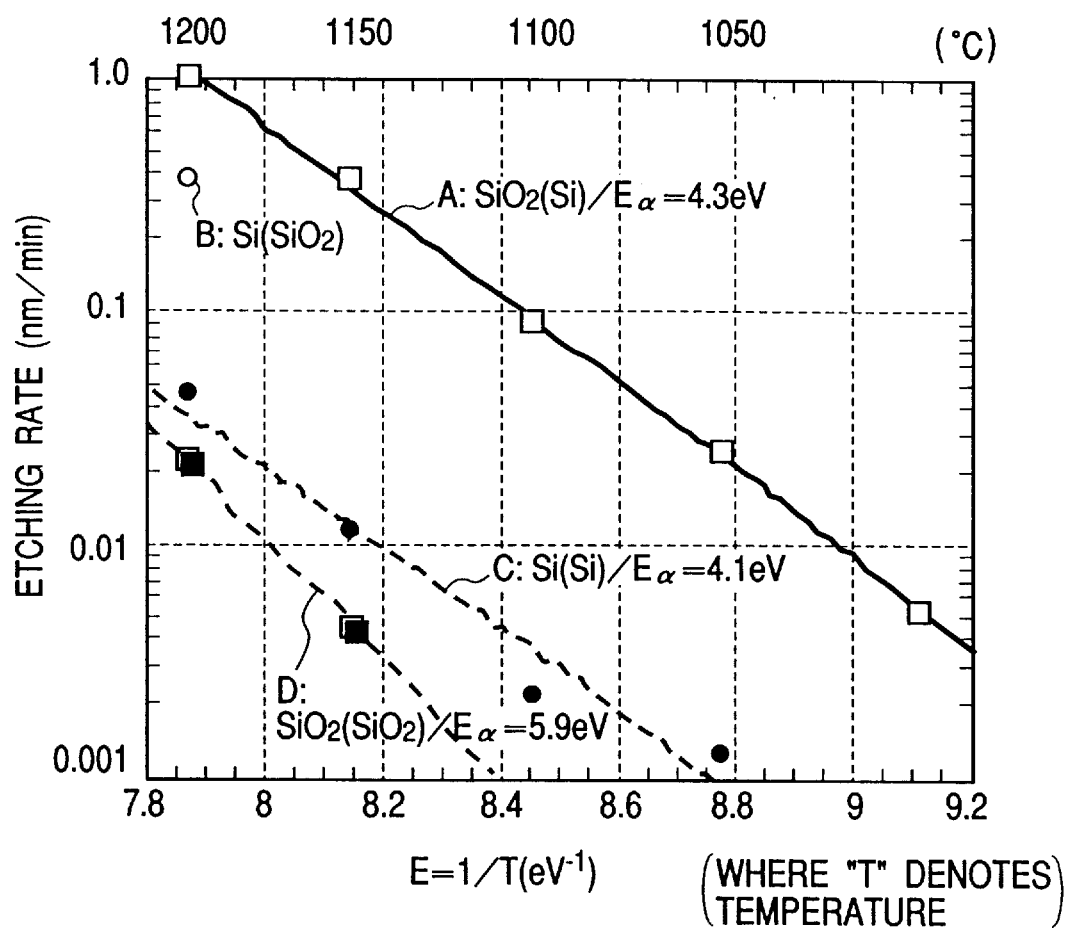
FIG. 16 is a graph showing the temperature-dependencies of etching rates dependent upon the materials of surfaces opposing to substrates, in the present invention.

FIG. 16 is a graph showing the temperature-dependence of etching rate dependent upon the material of opposing surfaces. In the figure, the lower axis of abscissas represents the inverse numbers of temperatures T in terms of the inverse numbers of electron volts (eV). The upper axis of abscissas represents temperatures corresponding to 1/T. The axis of ordinates indicates the logarithmic plots of the etching rates (nm/minute).

In case of an SOI substrate, the thickness of the SOI layer, namely, the single-crystal silicon layer on a buried insulator layer can be measured comparatively easily by the use of a film-thickness meter of light reflection type being commercially available. While the time period of the heat treatment is being changed, the variation (rate of change) of the film thicknesses before and after each heat treatment is measured, and a gradient versus the etching time period is found. Then, the etching rate is obtained.

In the graph of FIG. 16, data A indicates the etching rates at individual temperatures as were obtained in a case where a base material to-be-etched (material for a substrate) $SiO_2$ was held in opposition to an opposing surface material Si. In this case, activation energy $E_a$ was calculated to be about 4.3 eV from the gradient of the approximate straight line of plots based on the method of least square. By the way, brackets for each illustrated data indicate the material of the opposing surface.

In addition, data B corresponds to a case where the heat treatment was performed with a base material Si held in opposition to an opposing surface material $SiO_2$.

Besides, data C corresponds to the heat treatment which was performed with the base material Si held in opposition to the opposing surface material Si. In this case, the activation energy $E_a$ was about 4.1 eV.

Further, data D corresponds to the heat treatment which was performed with the base material $SiO_2$ held in opposition to the opposing surface material $SiO_2$. In this case, the activation energy $E_a$ was about 5.9 eV.

It has been revealed that, with the heat treatment in the reducing atmosphere containing hydrogen, the etching rate of silicon as the base material is increased to about 9 times without regard to temperatures as indicated by the difference between the etching rates of the data B and C in FIG. 16, by changing the opposing surface material from silicon to silicon oxide.

In the case where both the base material and the opposing surface material are single-crystal silicon, the etching rate of about 0.045 nm/min at 1200° C. is considerably low (data C in FIG. 16). The quantity of etching by the heat treatment for 60 minutes is less than 3 nm. On the other hand, in the case where the material of the opposing surface to silicon is silicon oxide, the etching rate is about 0.36 nm/min at 1200° C. (data B in FIG. 16), and the quantity of etching for one hour reaches 21.6 nm. This quantity of etching is near to the quantity of etching in the case of touch polish.

FIG. 17 is a graph showing the quantity of etching in the cases where a base material Si opposes to an opposing surface material $SiO_2$, and where a base material $SiO_2$ opposes to an opposing surface material Si. The axis of abscissas represents the time period of etching (in minutes), while the axis of ordinates represents the thickness of etching (in nm). A white dot corresponds to the case of heat-treating $SiO_2$ (base material) in opposition to Si (opposing surface material), and a black dot the case of heat-treating Si in opposition to $SiO_2$. The temperature T of the heat treatment is 1200° C.

As illustrated in FIG. 17, subject to the same time period of the heat treatments, the quantity of etching is larger in the case of heat-treating $SiO_2$ in opposition to Si as indicated by the white dot, than in the case of etching Si in opposition to $SiO_2$ as indicated by the black dot. That is, in the cases of heat-treating $SiO_2$ and Si in opposition to each other, $SiO_2$ is etched more (the thickness of etching thereof is greater).

FIG. 18 illustrates the numbers of Si atoms computed from the results of FIG. 17, the Si atoms being removed when a Si surface and an $SiO_2$ surface are respectively etched in the etching of the base material $SiO_2$ held in opposition to the opposing surface material Si, and in the etching of the base material Si held in opposition to the opposing surface material $SiO_2$. The axis of abscissas represents the time period of the etching, while the axis of ordinates represents the number of the removed Si atoms (in atoms/cm²). In the graph of FIG. 18, a circle, a triangle and a square in white correspond to the $SiO_2$ surface, while ones in black correspond to the Si surface.

When the quantities of etching of the silicon oxide surface and the single-crystal silicon surface illustrated in FIG. 17 were calculated in terms of the numbers of silicon atoms, generally agreeing results have been obtained as illustrated in FIG. 18. It is accordingly indicated that, in the cases of heat-treating the Si surface and $SiO_2$ surface in opposition to each other, both the surfaces are deprived of the same amounts of Si atoms.

That is, the etching of silicon is speeded up by the interaction thereof with the opposing silicon oxide surface. The reaction formula of the etching is comprehensively given by the following, in which silicon and silicon oxide react at 1:1:

$$Si+SiO_2 \rightarrow 2SiO$$

Besides, such an etching rate of Si is affected by the distance of the surface to-be-etched from the opposing surface. In the case of arranging silicon as the opposing surface material, the etching rate is restrained more as the distance between the surfaces is shorter, and in the case of arranging silicon oxide as the opposing surface material, the etching rate is heightened more as the distance between the surfaces is shorter.

Meanwhile, an etching rate in the case where a reducing gas typified by hydrogen was not contained in the atmosphere of a heat treatment, was conspicuously lower than in the case of the atmosphere containing hydrogen. That is, the presence of the reducing gas typified by hydrogen contributes as one factor for speeding up the etching in the hydrogen annealing. In the case where the surfaces of silicon and silicon oxide oppose to each other, both the surfaces are etched in such a way that the material of either of the surfaces arrives at the other surface to react with the material of this surface, through a reaction with the reducing gas typified by hydrogen. By way of example, there are reactions; $Si+H_2 \rightarrow SiH_2$ and $SiH_2+SiO_2 \rightarrow 2SiO+H_2$. Si atoms dissociated from the Si surface are transported in a gaseous phase to react with $SiO_2$ at the silicon oxide surface, thereby to be turned into SiO the saturated vapor pressure of which is high. Since $SiH_2$ is consumed on occasion, the etching at the Si surface is promoted. Further, in the case where the surfaces of Si oppose to each other, the etching rate is not considerably heightened, for the following reason: When Si atoms dissociated from the Si surface have reached its saturation concentration in a gaseous phase, the rate of the succeeding reaction is determined by the diffusion of the Si atoms in the gaseous phase. Nevertheless, the saturation concentration of the dissociated Si atoms is not high.

On the other hand, in the case where the surface $SiO_2$ is held in opposition to the surface Si, Si atoms dissociated from the Si surface are consumed at the oxide film surface, and hence, the reaction further proceeds. Since SiO produced on the side of the $SiO_2$ surface has a high vapor pressure, the rate of the reaction is more difficult to be determined than in the case of the opposition of the Si surfaces.

In addition, the quantity of etching of a single-crystal silicon film in the case where the material of a surface opposing to the single-crystal silicon film was SiC (silicon carbide), was substantially equal to that in the case where the material of the opposing surface was silicon. Besides, in a case where the material of an opposing surface was silicon nitride, the quantity of etching of a single-crystal silicon film was restrained similarly to that in the case where the material of the opposing surface was silicon.

More specifically, the quantity of etching of the single-crystal silicon film in the case where the material of the opposing surface is silicon oxide becomes about 10 times as compared with that in the case where the opposing surface, which opposes to the single-crystal silicon film in the heat treatment of this film as is performed in the atmosphere containing hydrogen, is made of silicon or a material which contains silicon and carbon as its main components and which does not contain oxygen as its main component.

Further, the distance of the semiconductor base material to-be-etched from the opposing surface depends upon the size of a surface where the single-crystal silicon film as the semiconductor base material is existent. As regards the semiconductor base material having a diameter of at least 100 mm, the effect of increasing the etching rate as is based on the interaction with the opposing surface material is attained if the distance is about 20 mm or shorter, more preferably 10 mm or shorter.

Figure 19:
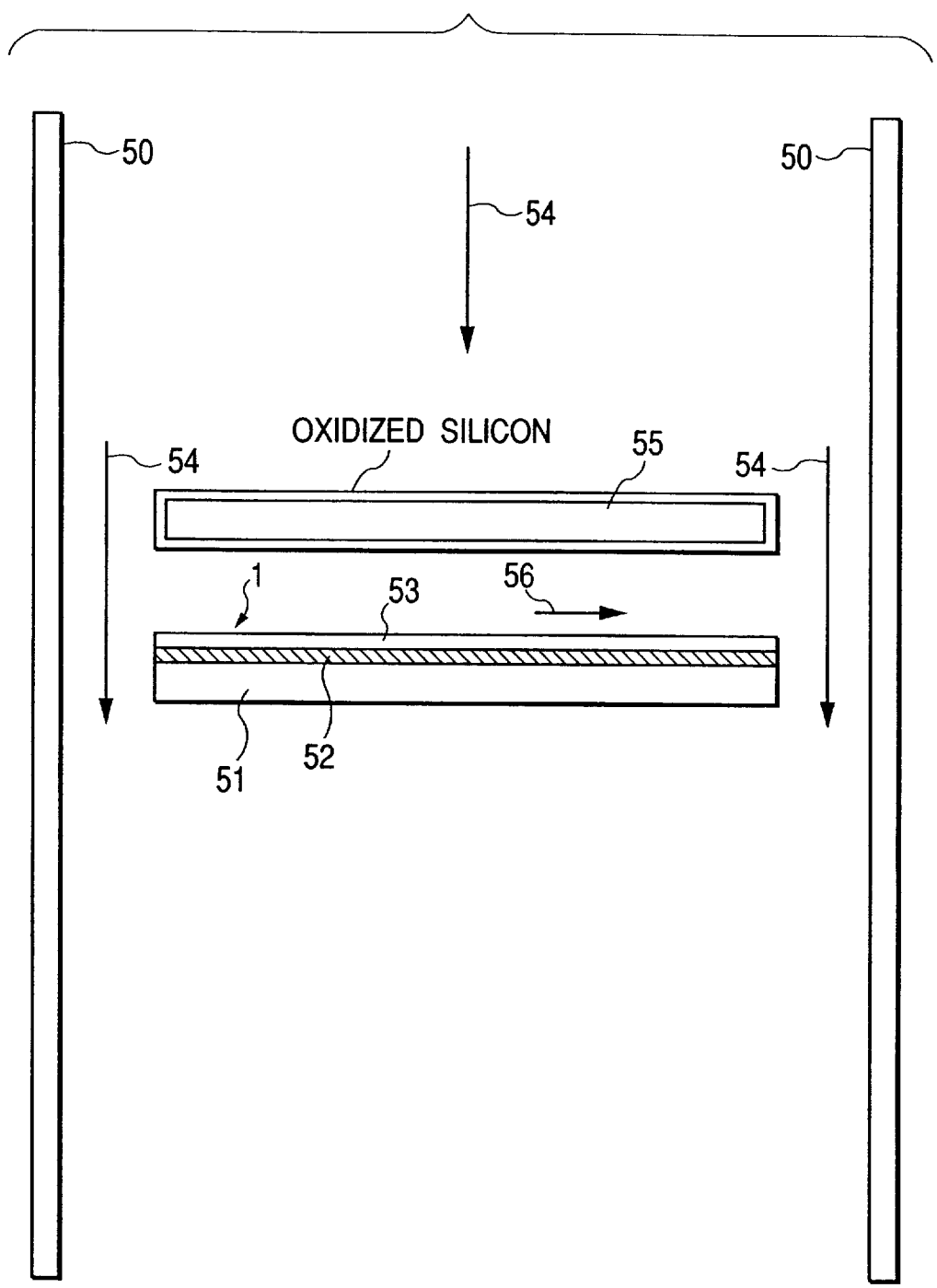
FIG. 19 is a schematic sectional view showing an example of arrangement in the case where the material of an opposing surface is oxidized silicon, in the present invention.

Still further, the etching rate of single-crystal silicon at the principal surface of the semiconductor base material in the heat-treating process which is performed in the reducing atmosphere containing hydrogen, is increased in the presence of oxidizing impurities, such as a water content and an oxygen content, which are contained in the atmosphere gas. In order to suppress the supplies of the oxidizing impurities, therefore, the flow velocity of the atmosphere gas in the vicinity of the principal surface is lowered. Thus, etching components ascribable to the impurity gases are decreased, so that the etching controllability of the present invention based on the interaction with the opposing surface is heightened. Especially in a case illustrated in FIG. 19 where a single-crystal silicon film 53 formed on the principal surface of a semiconductor base material 51 (constituting a wafer 1) through an insulator 52 is arranged in a core tube 50 so as to be normal to a gas flow 54, and where an opposing surface 55 made of silicon oxide is arranged therein, the flow velocity 56 of an atmosphere gas over the principal surface can be made substantially zero, and the effect of etching based on the opposing silicon oxide can be sufficiently brought forth.

Still further, in a case where silicon as a base material is etched by forming an opposing silicon oxide film on silicon or on a material which contains silicon and carbon as its main components and which does not contain oxygen as its main component, that is, which does not react with the base material silicon through a gaseous phase, the rate of the etching lowers to about ¹⁄₁₀ when the silicon oxide film has been lost by the decrease of its thickness based on the etching. Therefore, when the thickness of the oxide silicon film is previously set at a thickness at which Si atoms equal in number to the amount of Si atoms corresponding to the thickness of the base material silicon intended to be removed by the etching are contained in the silicon oxide film, the amount of removal of the base material Si can be controlled. Regarding a silicon oxide film formed by the thermal oxidation which is usually employed in a semiconductor process, the thickness of the opposing silicon oxide film may be set about 2.22 times the thickness of the silicon film intended to be removed.

When the influences of opposing surfaces were estimated as to smoothening rough surfaces, no remarkable difference was noted.

Figure 20:
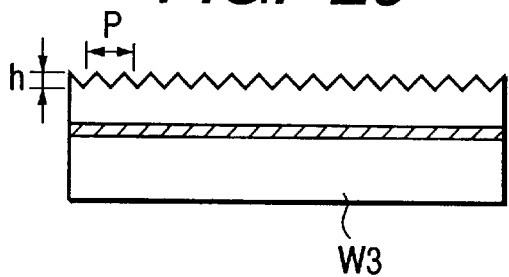
FIGS. 20 and 21 are schematic sectional views for explaining an operational effect based on an etching method in the present invention.
Figure 21:
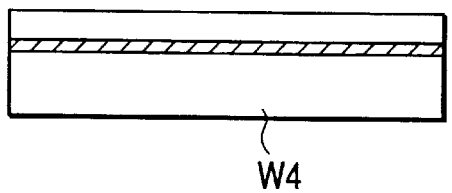

FIG. 20 is a schematic sideward sectional view showing a surface immediately after a remaining separation layer has been removed by etching, the surface being to be smoothened by hydrogen annealing. When the rough surface shown in FIG. 20 was heat-treated in a reducing atmosphere, it could be smoothened equally to the surface of a commercially-available silicon wafer as illustrated in FIG. 21. In FIGS. 20 and 21, symbols W3 and W4 denote an SOI substrate.

It has been revealed that, when the surface (in FIG. 20) of single-crystal silicon in which ruggedness is observed at a height h of several nm to several tens nm and a period P of several nm to several hundred nm is heat-treated in a reducing atmosphere (as hydrogen annealing), a surface (in FIG. 21) being as flat as the surface of the single-crystal silicon wafer is obtained at a level difference of several nm or below, and more preferably at a level difference of 2 nm or below under more appropriate conditions.

It has also been revealed that the quantity of etching based on the hydrogen annealing can be controlled by properly selecting an opposing surface material which opposes to the SOI layer of the SOI substrate.

This phenomenon is considered to be the reconstruction of the surface rather than the etching. More specifically, in the rough surface, angled parts of high surface energy are innumerably existent, and the faces of higher-order face orientations than the face orientation of the crystal layer are exposed to the outer surface in large numbers. The surface energy levels of these regions are higher as compared with a surface energy level which depends upon the face orientation of the single-crystal surface. With the heat treatment which is performed in the reducing atmosphere containing hydrogen, the natural oxide film of the surface is removed by, for example, the reducing action of hydrogen. Moreover, during the heat treatment, no natural oxide film is produced in consequence of the reducing action. It is therefore considered that an energy barrier to the migration of surface Si atoms will lower, and that Si atoms excited by thermal energy will migrate to construct the flat surface of low surface energy. As the face orientation of the single-crystal surface is of lower indices, the flattening according to the present invention is promoted more.

As explained above, the etching rate of silicon can be increased using silicon oxide as the material which opposes to the surface (SOI layer) to-be-processed in the hydrogen annealing. In the present invention, accordingly, even when a separation layer formed by ion implantation remains on the surface of the SOI layer after the step of separation, the remains of the surface of the SOI layer can be efficiently removed by the hydrogen annealing.

With the atmosphere containing hydrogen, the rough surface can be satisfactorily smoothened even at a temperature of 1200° C. or lower at which it cannot be smoothened with a nitrogen atmosphere or a rare gas atmosphere. The temperatures of the smoothening and etching operations according to the present invention should lie from about 300° C. to below the fusion point of the material to-be-processed, preferably be 500° or higher, more preferably be 800° C. or higher, and especially be 1200° C. or higher, though they depend also upon the compositions, pressures etc. of processing gases. Besides, in a case where the smoothening proceeds slowly, the heat-treating period of time is lengthened, whereby a smooth surface can be similarly obtained. Regarding the influence of the constituent material of the opposing surface, the pressure of the gas may be lowered, whereby the etching based on the interaction with the opposing surface can be made more efficient even for the same surface interval. This is because the diffusion length of gaseous molecules increase with the lowering of the pressure.

Oxygen and water contents remaining in the atmosphere oxidize the surface of silicon and hinder the smoothening of the surface as a film while the temperature of the heat treatment is being raised. Therefore, the contents need to be suppressed low. At the high temperature of the heat treatment, the oxygen and water contents give rise to the unexpected decrease of the thickness of the silicon film on account of oxidation+etching. Therefore, the contents similarly need to be suppressed low. In terms of a dew point, the contents should desirably be controlled to −92° C. or below.

This phenomenon begins to proceed for the reason that a surface to-be-processed is heat-treated in a clean state. Therefore, in such a case where the natural oxide film is formed thick on the surface, it is removed by etching with dilute fluoric acid or the like in advance of the heat treatment. Thus, it is quickened to start the smoothening of the surface.

The smooth single-crystal surface obtained in this way can be used favorably also from the viewpoint of the production of a semiconductor device.

No remarkable difference dependent upon the material of an opposing surface was not noted as to the out-diffusion of boron from a Si layer attributed to a heat treatment in an atmosphere containing $H_2$. This is so construed that, since the quantity of boron contained in single-crystal silicon is smaller than about 1/100 relative to silicon, the quantity of boron emitted into a gaseous phase will be much smaller than the quantity of silicon emitted by etching and will not become saturated.

Yonehara who is one of the inventors of the present invention, et al. have reported a process for manufacturing a bonded SOI substrate which is excellent in crystallinity and the uniformity of a film thickness and which can be batched (T. Yonehara et al., Appl. Phys. Lett., vol. 64, 2108 (1994); and U.S. Pat. No. 5,371,037).

Figure 29:
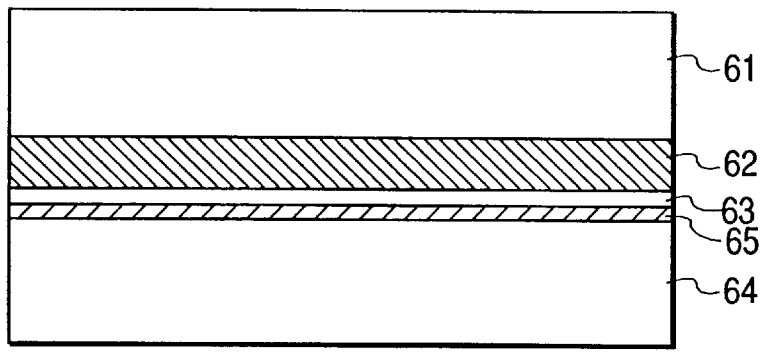
FIGS. 29, 30 and 31 are schematic sectional views showing an example of a process for manufacturing an SOI substrate.
Figure 30:
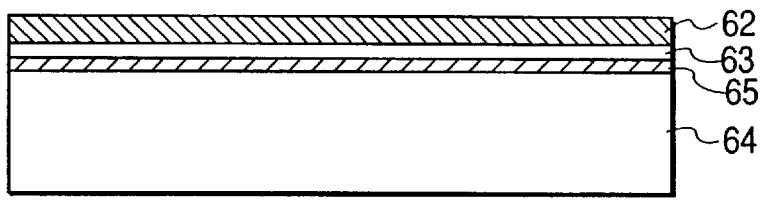
Figure 31:
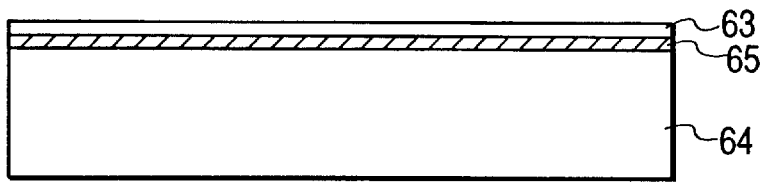

An example of this process is illustrated in the schematic sectional flow charts of FIGS. 29 to 31. First, a porous material layer 62 on a Si substrate 61 is used as the material of selective etching. A non-porous crystal Si layer 63 is epitaxially grown on the porous material layer 62. Thereafter, the resulting Si substrate 61 is bonded with a second substrate 64 through an oxide Si layer 65 (FIG. 29). Subsequently, the first substrate 61 is thinned from its back surface by a method such as grinding, until porous Si is exposed over the whole surface of the bonded substrate structure (FIG. 30). Subsequently, the exposed porous Si layer 62 is etched and removed with a selective etching solution such as KOH or a mixed solution consisting of $HF+H_2O_2$ (FIG. 31). Thus, the SOI substrate is obtained. Also in this case, hydrogen annealing should desirably be performed under the control of the quantity of etching, in order to more flatten and smoothen the surface of the SOI layer 63.

On this occasion, the selection ratio of the etching of the porous Si layer 62 relative to bulk Si (non-porous single-crystal Si) can be set as sufficiently high as 100,000 times. The SOI substrate can therefore be formed in a state where the non-porous single-crystal Si layer 63 grown on the porous material 62 beforehand is left behind on the second substrate 64 without appreciably decreasing the thickness of this layer 63.

Further, Sakaguchi who is one of the inventors of the present invention, et al. have disclosed the fact that, since the porous material layer 62 shown in FIG. 29 exhibits a lower mechanical strength, etc. as compared with the other regions, the bonded substrate structure (in FIG. 29) can be separated by utilizing the porous material layer 62 (official gazette of Japanese Patent Application Laid-Open No. 7-302889).

Embodiment 1

The first embodiment of the present invention will be described with reference to FIGS. 2 to 6.

Referring to FIG. 2, a first Si single-crystal substrate 10 is prepared. At least, the principal surface side of the first substrate 10 is heat-treated in a reducing atmosphere containing hydrogen, thereby to form in the surface of the substrate 10 a surface layer portion (less-defective layer) 12 in which defects ascribable to bulk are lessened. Although a region 11 and the less-defective layer 12 are illustrated here so as to change abruptly at a certain boundary, they change gradually in their actual situation. Thereafter, $SiO_2$ 13 is formed in the surface layer of the resulting first substrate so as to space the level of a bonding interface from an active layer (an SOI layer 16 to be explained later).

Subsequently, the ions of at least one element among a rare gas, hydrogen and nitrogen are implanted from the principal surface of the first substrate 10 bearing the insulator layer 13, thereby to form a separation layer (ion-implantation accumulation) 14 (FIG. 3). The separation layer 14 is formed within the less-defective layer 12. Since the ions are implanted into the less-defective layer 12, the position of the separation layer 14 can be defined strictly and uniformly.

Subsequently, as shown in FIG. 4, the resulting first substrate 10 is bonded with a second substrate 15 at a room temperature so that the insulator layer 13 may lie inside.

Although FIG. 4 illustrates the state in which the second substrate 15 and the first substrate 10 are bonded to each other through the insulator layer 13, this insulator layer 13 may well be omitted in case of a second substrate which is not of Si.

At the next step, the bonded substrate structure is separated or divided at the separation layer 14 (FIG. 5). The separation is effected by heat-treating the bonded substrate structure at a temperature of 400° C. to 600° C.

After the separation, defects such as micropores and dislocations are sometimes involved in the separation layer 14 remaining on the second substrate 15, and hence, the remaining separation layer 14 is selectively removed.

The selective removal is done using a desired etching solution. In a case where the remaining part of the separation layer 14 is slight, it can also be removed by hydrogen annealing. Alternatively, the ion-implantation accumulation layer 14 is removed by selective polishing in which the SOI layer 16 is used as a polishing stopper. The removal can also be done by ordinary polishing, not by the selective polishing.

Besides, in a case where the bonded substrate structure is separated at the interface between the SOI layer 16 and the separation layer 14, the step of removing the remaining separation layer 14 can be dispensed with.

FIG. 6 shows a semiconductor substrate which is obtained according to the present invention. The second substrate 15 is overlaid with the SOI layer, for example, single-crystal Si thin film 16 which is flattened and is uniformly thinned, and which is formed in a large area over the whole wafer. When the first and second substrates are bonded together through the insulator layer 13, the semiconductor substrate thus obtained can be appropriately used also from the viewpoint of producing the isolated elements of an electron device.

The first Si single-crystal substrate 11 can be used as a new first Si single-crystal substrate 11 or the next second substrate 15 again after removing the remaining ion-implantation accumulation layer 14 (and after surface flattening in a case where the surface of the first substrate 11 is rough to an unallowable degree).

The ion-implantation accumulation 14 on the first substrate side can also be reused through only a surface flattening process such as the heat treatment in the hydrogen containing atmosphere as explained above.

Embodiment 2

The second embodiment of the present invention will be described with reference to FIGS. 7 to 11.

Figure 7:
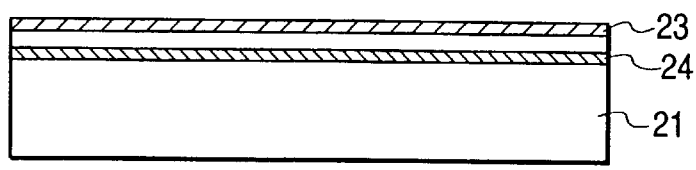
FIGS. 7, 8, 9, 10 and 11 are schematic sectional views showing another example of a process for manufacturing a semiconductor substrate in accordance with the present invention.
Figure 8:
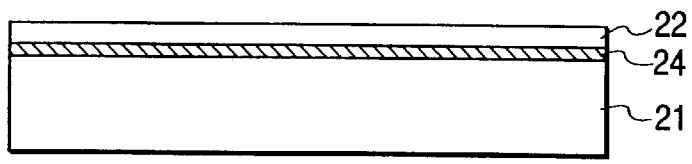
Figure 9:
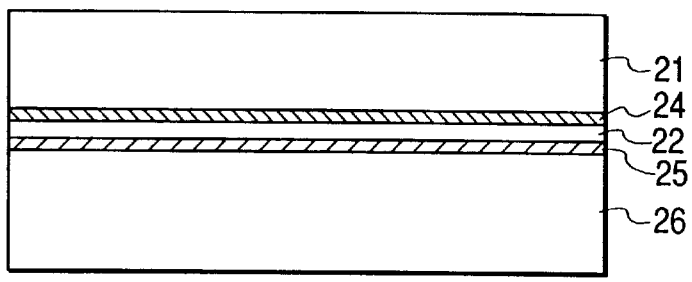

Referring to FIG. 7, a first Si single-crystal substrate 21 is prepared. The ions of at least one element among a rare gas, hydrogen and nitrogen are implanted from the principal surface of the first substrate 21, thereby to form ion-implantation accumulation (a separation layer) 24 within the first substrate 21. The previous formation of SiO$_2$ 23 as a surface layer is more favorable for the reason that the surface of the first substrate 21 can be prevented from being roughened by the ion implantation. In the case where the SiO$_2$ layer 23 has been formed, it is removed. Thereafter, at least the side of the principal surface of the substrate 21 is heat-treated in a reducing atmosphere containing hydrogen, thereby to form in the surface of the substrate 21 a layer (less-defective layer 22) in which defects ascribable to bulk are lessened (FIG. 8). In this embodiment, the hydrogen annealing should desirably be performed at a lower temperature of 500° C. or lower, or for a shorter time period of several seconds to several tens seconds. Herein, element structures such as MOSFETs may well be formed in the less-defective layer 22. Further, the previous formation of SiO$_2$ 25 as the surface layer of the less-defective layer 22 is more favorable in the sense that the level of a bonding interface can be spaced from the active layer 22. As shown in FIG. 9, the surfaces of a second substrate 26 and the resulting first substrate 21 are bonded together at room temperature.

In a case where the bonding strength of both the substrates is not sufficient, the bonded substrate structure is heat-treated at about 400° C. or is pressed.

Figure 10:
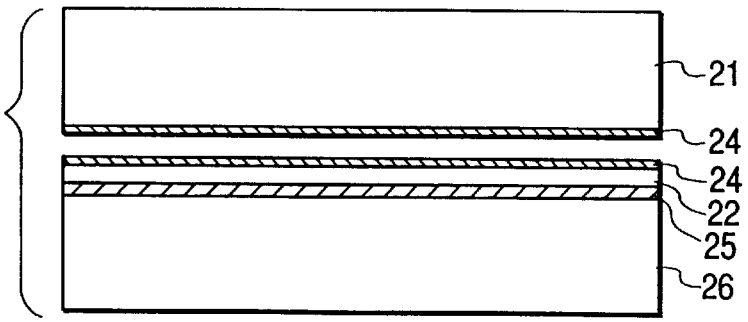

Subsequently, the bonded substrate structure is separated or divided at the separation layer 24 (FIG. 10). The separation is done by a method in which a fluid, for example, a liquid such as water or a gas such as nitrogen gas is sprayed against the side surface of the bonded substrate structure. Of course, the separation is not restricted to the method, but it may well be done by driving in a wedge or applying a tensile force.

Since defects such as micropores and dislocations are sometimes involved in the separation layer 24 remaining on the second substrate 26, the remaining separation layer 24 is selectively removed.

The selective removal of the remaining separation layer 24 can be done with an etching solution, or by selective polishing in which the SOI layer 22 is used as a polishing stopper. In a case where the remaining part of the separation layer 24 is very thin or slight, it can also be selectively removed by hydrogen annealing. In this case, in order to increase the rate of etching based on the hydrogen annealing, a substrate bearing silicon oxide (SiO$_2$) at its surface should desirably be opposed to the remaining separation layer 24 as an opposing material.

It is also allowed to properly combine two or three of the removing methods; the removal with the etching solution, the removal based on the polishing, and the removal based on the hydrogen annealing.

Figure 11:
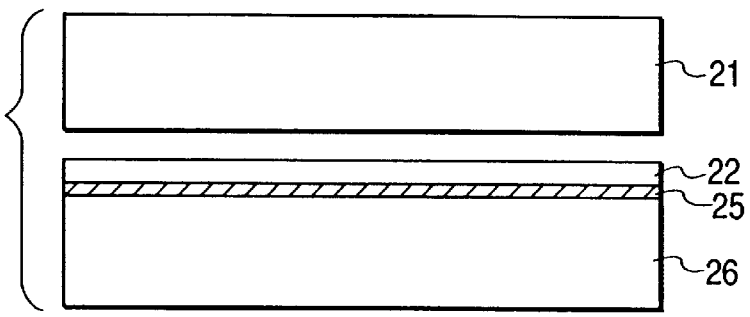

FIG. 11 shows a semiconductor substrate which is obtained according to the present invention. The second substrate 26 is overlaid with the single-crystal Si thin film 22 which is flattened and is uniformly thinned, and which is formed in a large area over the whole wafer. When the first and second substrates are bonded together through the insulator layer 25, the semiconductor substrate thus obtained can be appropriately used also from the viewpoint of producing the isolated elements of an electron device.

In this embodiment, the less-defective layer 22 is formed after the formation of the separation layer 24. It is therefore possible to obtain the SOI layer 22 from which even defects ascribable to the ion implantation for forming the separation layer 24 have been excluded.

By the way, in a case where the separation of the bonded substrate structure at the separation layer 24 is done at the interface between the SOI layer 22 and the separation layer 24, the step of removing the remaining separation layer is omitted, or the surface of the SOI layer 22 is somewhat etched by hydrogen annealing.

The first Si single-crystal substrate 21 can be used as a new first Si single-crystal substrate 21 or the next second substrate 26 again after removing the remaining separation layer 24 (and after surface flattening in a case where the surface of the first substrate 21 is rough to an unallowable degree). Of course, when the separation at the separation layer 24 is done at the interface between the second substrate 26 and the separation layer 24, the step of removing the remaining separation layer 24 can be dispensed with.

The separation layer 24 on the first substrate side can also be reused through only a surface flattening process such as the heat treatment in the hydrogen containing atmosphere as explained above.

In the heat treatment which is performed in the reducing atmosphere containing hydrogen, when the remaining surface of the separation layer 24 of the second substrate 26 bearing the SOI layer 22 is held in opposition to silicon oxide, the opposing silicon oxide and the constituent silicon of the separation layer 24 react through the atmosphere as:

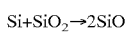

$$Si+SiO_2 \rightarrow 2SiO$$

It is therefore possible to efficiently remove the remaining separation layer 24. Simultaneously, the migration of Si proceeds so as to lower the surface energy of the SOI layer 22, with the result that the surface of this layer 22 is smoothened.

Embodiment 3

Figure 13:
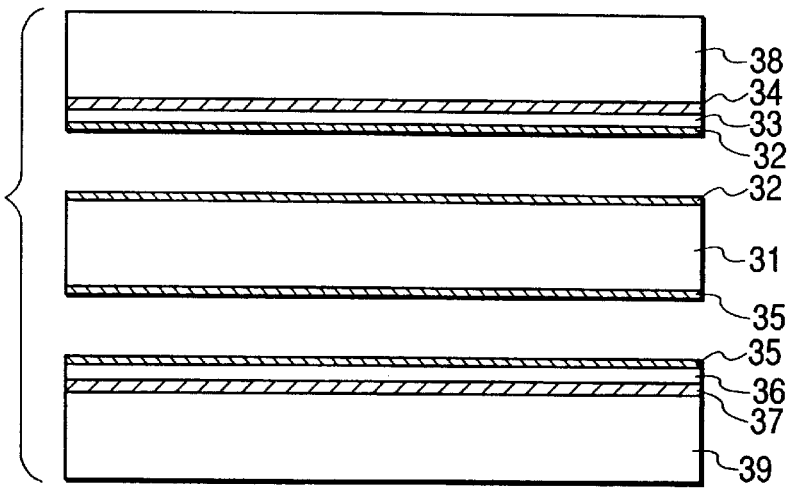
Figure 14:
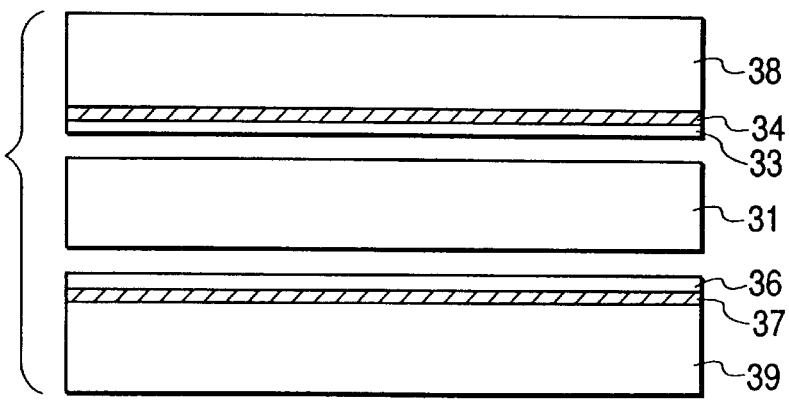

The third embodiment of the present invention will be described with reference to FIGS. 12 to 14.

Figure 12:
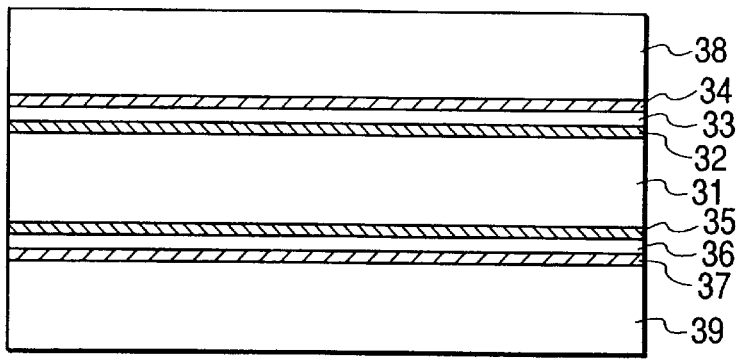
FIGS. 12, 13 and 14 are schematic sectional views showing still another example of a process for manufacturing a semiconductor substrate in accordance with the present invention.

As illustrated in FIG. 12, the above-explained steps in Embodiments 1 or 2 are performed on both the surfaces of a first substrate by employing two second substrates. This is intended to manufacture two semiconductor substrates (SOI substrates) at the same time.

In FIG. 12, numeral 31 designates the first substrate, numerals 32 and 35 designate ion-implanted layers (separation layers), numerals 33 and 36 designate less-defective layers, numerals 34 and 37 designate SiO$_2$ layers, and numerals 38 and 39 designate the second substrates. FIG. 12 is a sectional view showing a state where, after both the surfaces of the first substrate 31 have been subjected to the steps explained in Embodiment 1, the second substrates 38 and 39 are respectively bonded onto the surfaces of the resulting first substrate 31. FIG. 13 is a sectional view showing a state where the bonded substrate structure has been separated or divided at the separation layers 32 and 35 likewise to the separation in Embodiment 1, while FIG. 14 is a sectional view showing a state where the separation layers 32 and 35 have been removed. Of course, the removal of the remaining separation layers can be omitted when the bonded substrate structure is separated at the interfaces between the separation layer 32 and the less-defective layer 33 and between the separation layer 35 and the less-defective layer 36.

The first Si single-crystal substrate 31 can be used as a new first Si single-crystal substrate 31 or the next second substrate 38 (or 39) again after removing the remaining ion-implantation accumulation layers 32 and 35 (and after surface flattening in a case where the surfaces of the first substrate 31 are rough to an unallowable degree).

The ion-implantation accumulation layers 32 and 35 on the first substrate side can also be reused through only a surface flattening process such as the heat treatment in the hydrogen containing atmosphere as explained before.

The supporting substrates 38 and 39 need not be the same substrates. Besides, the insulator layers 34 and 37 may well be omitted.

Now, the examples of the present invention will be described in detail with reference to the drawings.

EXAMPLE 1

There were prepared two, first single-crystal Si substrates (8 inches in diameter) fabricated by the CZ method. Each of the first substrates was subjected to hydrogen annealing, to enhance the quality of its surface layer, in other words, to form a less-defective layer in its surface. The hydrogen annealing was performed under the conditions of an atmosphere of $H_2$ gas, a temperature of 1200° C. and for a time period of one hour.

After one of the two CZ silicon wafers stated above was cleaned with the SC-1 washing liquid (a mixed solution consisting of 1.0 weight-% of $NH_4OH$, 6.0 weight-% of $H_2O_2$, and water), the number of COPs involved in the surface of the washed wafer was detected by a foreign-matter inspection device. Then, the number of COPs was 8 per unit wafer. That is, the density of COPs was about $0.02/cm^2$. Herein, particles whose sizes were approximately more than 0.1 $\mu$pm were detected as the COPs.

Incidentally, the number X of COPs per unit wafer shall be expressed as "X/W" below.

The surface of the first substrate (the other CZ silicon wafer) was formed with an $SiO_2$ layer of 200 nm by thermal oxidation. Further, ions $H^+$ were implanted into the first substrate through the surface $SiO_2$ layer thereof under the conditions of an acceleration energy of 40 keV and a dose of $5 \times 10^{16}$ cm$^2$. The projection range of the ion implantation was adjusted so as to lie within the less-defective layer. Thus, the first substrate came to have the single-crystal silicon layer (SOI layer or less-defective layer) on a separation layer.

The surface of the resulting first substrate on the $SiO_2$ layer side thereof was placed on and touched with the surface of a Si substrate (second substrate) prepared separately. When the touched substrate structure was heat-treated at 600° C., it was separated or divided into two parts near the projection range of the ion implantation. Since the ion-implanted layer (separation layer) was porous, the surfaces of the separated parts were rough. The separation layer remaining on the resulting second substrate was removed in such a way that the surface of the second substrate side was selectively etched while a mixed solution consisting of 49% of hydrofluoric acid, 30% of hydrogen peroxide and water was being stirred. The single-crystal Si of the SOI layer remained without being etched, and the ion-implanted layer was selectively etched and completely removed with the single-crystal Si as an etch stopping material.

The rate of the etching of the non-porous Si single crystal by the above etching liquid is very low, and the quantity of the etching of the Si single crystal (on the order of several tens angstroms) corresponds to a thickness decrease which is negligible in practical use.

Apart from the selective etching, non-selective etching or polishing such as touch-polish and CMP can be employed for removing the ion-implanted layer. This is the same to other examples. In case of the polishing, the surface of the SOI substrate need not be flattened by a heat treatment in hydrogen. However, in a case where polishing damages remain, it is more favorable to perform the heat treatment or to remove the surface layer of the SOI substrate.

Concretely, a single-crystal Si layer having a thickness of 0.2 $\mu$m could be formed on the Si oxide film. The thickness of the formed single-crystal Si layer was measured at 100 points over the whole surface of the SOI substrate. Then, the uniformity of the layer thickness was 201 nm±6 nm. In this manner, the manufactured SOI substrate was very excellent in the uniformity of the thickness of the SOI layer. The number of COP defects involved in the surface of the SOI layer was 65/W. Since the number of COPs involved in the surface of an ordinary CZ wafer is 400/W or so, it is understood that the SOI layer being much less defective has been obtained according to the present invention.

Further, the SOI substrate was heat-treated at 1100° C. in hydrogen for one hour. When the surface roughness of the resulting SOI substrate was estimated with an interatomic-force microscope, the root-mean-square thereof ($R_{rms}$) in a region of 50 $\mu$m-square was about 0.2 nm and was equivalent to that of an ordinary Si wafer commercially available. The number of COPs involved in the surface of the SOI layer was 8/W.

Incidentally, when the SOI layer is subjected to hydrogen annealing after the separation step, the number of COPs in the outermost surface of the SOI layer can be further lessened, and the distribution of defects within the SOI layer can be uniformalized. These effects will be concretely explained in conjunction with FIG. 23.

Figure 23:
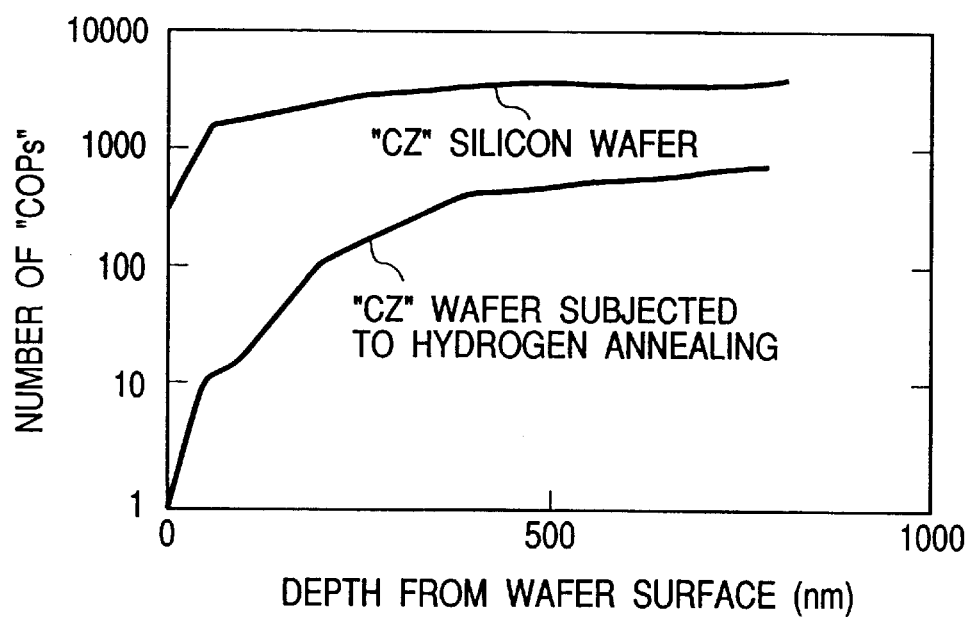
FIG. 23 is a graph showing the relationships between a depth from a wafer surface and the number of COPs per unit wafer.

FIG. 23 is a graph showing the relationship between the number of COPs per unit wafer and a depth from a wafer surface, as to each of a CZ silicon wafer (8 inches in diameter) and a wafer obtained by subjecting the CZ silicon wafer to hydrogen annealing ("NIKKEI MICRODEVICE", February issue (1998), p. 31). In the CZ silicon wafer subjected to the hydrogen annealing, the number of COPs is the smallest in the vicinity of the wafer surface and becomes larger with the depth from the wafer surface as seen from the graph, though the situation differs depending also upon the conditions of the hydrogen annealing.

By way of example, an SOI substrate is formed in such a way that the projection range of ions (a separation layer) is set near 400 nm from the surface of the CZ silicon wafer having undergone the hydrogen annealing, that the resulting wafer is bonded with a second substrate, and that the bonded structure is thereafter separated at the separation layer. In this case, the number of COPs is the largest at the outermost surface of an SOI layer, and it becomes smaller as the interface between the SOI layer and an insulator layer comes nearer. Accordingly, in a case where the number of COPs in the vicinity of the surface of the SOI layer needs to be further decreased, it is more favorable to perform the hydrogen annealing even after the separation step. On this occasion, both the surfaces of the SOI layer are made less defective by the hydrogen annealing.

By the way, in order to facilitate the detection of the number (density) of COPs involved in the surface of the SOI layer, the SOI substrate was processed with the SC-1 liquid (a mixed solution consisting of 1.0 weight-% of $NH_4OH$, 6.0 weight-% of $H_2O_2$, and water) for 10 minutes. Besides, the detection was done using a surface-particle inspection instrument (for example, "SP-1" fabricated by KLA Tencor Inc.).

Even when the separated SOI substrate left intact is heat-treated in hydrogen without removing the remaining ion-implanted layer, the exclusion of micropores and defects and the flattening of the surface of the SOI layer are simultaneously caused by the migration of Si, with the result that the ion-implanted layer is extinguished.

The section of the Si layer was observed with a transmission electron microscope. As a result, it was confirmed that no new crystal defect was introduced into the Si layer, and that a good crystallinity was kept in the Si layer.

Also, the ion-implanted layer remaining on the first substrate side was selectively etched while a mixed solution comprising of 49% concentration of hydrofluoric acid, 30% concentration of hydrogen peroxide and water was being stirred. Thereafter, the first substrate was subjected to a surface process such as hydrogen annealing or surface polishing. The resulting first substrate could be used as a new first substrate or a new second substrate again.

Even when the separated first substrate left intact is heat-treated in hydrogen without removing the remaining ion-implanted layer, the exclusion of micropores and defects and the flattening of the surface of the substrate are simultaneously caused by the migration of Si, with the result that the ion-implanted layer is extinguished.

Incidentally, the ion-implanted region also exhibits a gettering effect. Even in the presence of metal impurities, it is possible to separate the two bonded substrates after the impurities have been gettered by the ion-implanted region, and to thereafter remove the resulting ion-implanted region. Therefore, the SOI substrate according to the present invention is also effective in case of contamination with the impurities.

EXAMPLE 2

There were prepared two, first single-crystal Si substrates (8 inches in diameter) fabricated by the CZ method. Each of the first substrates was heat-treated under conditions mentioned below, to enhance the quality of its surface layer. One of the two first substrates was used for an analysis.

The heat treatment (hydrogen annealing) was performed under the conditions of an atmosphere of $H_2$ gas, a temperature of 1200° C. and for a time period of two hours, whereby a less-defective layer was formed in the surface of each first substrate. When the number of COPs involved in the surface layer of the first substrate for the analytic use was inspected with a foreign-matter inspection device, it was about 5/W.

Further, ions $H^+$ were implanted into the first substrate under the conditions of an acceleration voltage of 50 keV and a dose of $6 \times 10^{16}$ cm$^{-2}$. The projection range of the ion implantation lay in the vicinity of about 600 nm measured from the surface of the substrate.

The surface of the resulting first substrate was placed on and touched with the surface of a Si substrate (second substrate) which was formed with an $SiO_2$ layer of 500 nm and which was prepared separately. When the touched substrate structure was annealed at 550° C., it was separated or divided into two parts near the projection range of the ion implantation. Since the ion-implanted layer was porous, the surfaces of the separated parts were rough. The surface on the second substrate side was selectively etched while a mixed solution consisting of 49% of fluoric acid, 30% of hydrogen peroxide and water was being stirred. The single-crystal Si of the SOI layer remained without being etched, and the ion-implanted layer was selectively etched and completely removed with the single-crystal Si as an etch stopping material.

Apart from the selective etching, non-selective etching or polishing can be employed for removing the ion-implanted layer. In case of the polishing, the surface of the SOI substrate need not be flattened by a heat treatment in hydrogen. However, in a case where polishing damages remain, it is more favorable to perform the heat treatment or to remove the surface layer of the SOI substrate.

The rate of the etching of the non-porous Si single crystal by the above etching liquid is very low, and the quantity of the etching of the Si single crystal (on the order of several tens angstroms) corresponds to a thickness decrease which is negligible in practical use.

Thereafter, only the extreme surface of the non-porous Si single crystal was flattened by polishing.

Concretely, a single-crystal Si layer (SOI layer) having a thickness of 0.5 µm could be formed on the Si oxide film. The thickness of the formed single-crystal Si layer was measured at 100 points over the whole surface of the SOI substrate. Then, the uniformity of the layer thickness was 498 nm±15 nm. The number of COPs involved in the surface of the SOI layer was on the order of 50/W. In this manner, the number of COPs was 50/W in the outer surface of the SOI layer. Besides, the number of COPs within the SOI layer on the Si oxide film side thereof was 5/W. It is accordingly understood that the density of the COPs lowers from the outer surface of the SOI layer toward the interior thereof. Since the number of COPs involved in the surface of an ordinary CZ wafer is 400/W or so, it is understood that the SOI layer is made much less defective according to the present invention.

When the surface roughness of the resulting SOI substrate was estimated with an interatomic-force microscope, the root-mean-square thereof ($R_{rms}$) in a region of 50 µm-square was about 0.2 nm and was equivalent to that of an ordinary Si wafer commercially available.

The section of the Si layer was observed with a transmission electron microscope. As a result, it was confirmed that no new crystal defect was introduced into the Si layer, and that a good crystallinity was kept in the Si layer.

By the way, when the SOI substrate obtained in this example is further subjected to hydrogen annealing, the number of COPs involved in the surface of the SOI layer can be further lessened to become closer to the number of COPs (5/W) involved in the interior of the SOI layer vicinal to the Si oxide film.

In this manner, both the surfaces of the single-crystal silicon layer being the SOI layer on the Si oxide film are subjected to the hydrogen annealing, whereby the defects of COPs etc. inherent in the bulk wafer as are involved in the SOI layer can be decreased. Even if the defects remain yet, the distribution thereof can be substantially uniformalized within the SOI layer.

Also, the ion-implanted layer remaining on the first substrate side was selectively etched while a mixed solution consisting of 49% of hydrofluoric acid, 30% of hydrogen peroxide and water was being stirred. Thereafter, the first substrate was subjected to a surface process such as hydrogen annealing or surface polishing. The resulting first substrate could be used as a new first substrate or a new second substrate again.

Even when the separated first substrate left intact is heat-treated in hydrogen without removing the remaining ion-implanted layer, the exclusion of micropores and defects and the flattening of the surface of the substrate are simultaneously caused by the migration of Si, with the result that the ion-implanted layer is extinguished.

EXAMPLE 3

There was prepared a first single-crystal Si substrate (8 inches in diameter) fabricated by the CZ method. The first substrate was heat-treated to enhance the quality of its surface layer. As the heat treatment, hydrogen annealing was performed under the conditions of an atmosphere of $H_2$ gas, a temperature of 1200° C. and for a time period of four hours.

Further, the surface of the substrate was formed with an $SiO_2$ layer of 200 nm by thermal oxidation. Besides, ions $H^+$ were implanted into the substrate through the surface $SiO_2$ layer thereof under the conditions of an acceleration voltage of 40 keV and a dose of $5 \times 10^{16}$ $cm^{-2}$.

The surface of the resulting first substrate was placed on and touched with the surface of a Si substrate (second substrate) at a room temperature, the second substrate having been formed with an $SiO_2$ layer of 500 nm and prepared separately. Subsequently, the touched substrate structure was annealed at 300° C. so as to strengthen the bonding force of the first and second substrates. Thereafter, the bonded substrate structure was separated or divided at a separation layer (ion-implanted layer formed by the ion implantation stated above) by spraying a water jet with high water pressure (about 200 kg·f/$cm^2$) against the peripheral side surface of this bonded substrate structure. Herein, the bonded substrate structure was separated into two parts near the projection range of the ion implantation. Since the ion-implanted layer was porous, the surfaces of the separated parts were rough. The surface on the second substrate side was selectively etched to remove the remaining part of the separation layer, while a mixed solution consisting of 49% of fluoric acid, 30% of hydrogen peroxide and water was being stirred. The single-crystal Si of an SOI layer formed remained without being etched, and the ion-implanted layer was selectively etched and completely removed with the single-crystal Si as an etch stopping material.

Apart from the selective etching, non-selective etching or polishing can be employed for removing the ion-implanted layer. In case of the polishing, the surface of the SOI substrate formed need not be flattened by a heat treatment in hydrogen. However, in a case where polishing damages remain, it is more favorable to perform the heat treatment or to remove the surface layer of the SOI substrate.

The rate of the etching of the non-porous Si single crystal by the above etching liquid is very low, and the quantity of the etching of the Si single crystal (on the order of several tens angstroms) corresponds to a thickness decrease which is negligible in practical use.

Concretely, a single-crystal Si layer having a thickness of 0.2 $\mu$m could be formed on the Si oxide film. The thickness of the formed single-crystal Si layer was measured at 100 points over the whole surface of the SOI substrate. Then, the uniformity of the layer thickness was 201 nm ±6 nm.

Further, the SOI substrate was subjected to a heat treatment at 1100° C. in hydrogen for one hour. When the surface roughness of the resulting SOI substrate was estimated with an interatomic-force microscope, the root-mean-square thereof ($R_{rms}$) in a region of 50 $\mu$m-square was about 0.2 nm and was equivalent to that of an ordinary Si wafer commercially available. After the surface of the single-crystal silicon layer on the $SiO_2$ layer was washed with the SC-1 washing liquid, the number of COPs involved in the washed surface was measured by a foreign-matter inspection device. Then, the number of COPs was 3/W.

Incidentally, even when the separated SOI substrate left intact is heat-treated in hydrogen without removing the remaining ion-implanted layer, the exclusion of micropores and defects and the flattening of the surface of the SOI layer are simultaneously caused by the migration of Si, with the result that the ion-implanted layer is extinguished.

The section of the Si layer was observed with a transmission electron microscope. As a result, it was confirmed that no new crystal defect was introduced into the Si layer, and that a good crystallinity was kept in the Si layer.

Also, the ion-implanted layer remaining on the first substrate side was selectively etched while the mixed solution consisting of 49% of hydrofluoric acid, 30% of hydrogen peroxide and water was being stirred. Thereafter, the first substrate was subjected to a surface process such as hydrogen annealing or surface polishing. The resulting first substrate could be used as a new first substrate or a new second substrate again.

Even when the separated first substrate left intact is heat-treated in hydrogen without removing the remaining ion-implanted layer, the exclusion of micropores and defects and the flattening of the surface of the SOI layer are simultaneously caused by the migration of Si, with the result that the ion-implanted layer is extinguished.

Although the bonded substrate structure was separated by the water jet in this example, it can alternatively be separated by spraying a gas, such as nitrogen gas, under high pressure.

EXAMPLE 4

There was prepared a first single-crystal Si substrate (8 inches in diameter) fabricated by the CZ method. The first substrate was heat-treated to enhance the quality of its surface layer. As the heat treatment, hydrogen annealing was performed under the conditions of an atmosphere of $H_2$ gas, a temperature of 1100° C. and a time period of four hours.

Further, the surface of the substrate was formed with an $SiO_2$ layer of 200 nm by thermal oxidation. Besides, ions $H^+$ were implanted into the substrate through the surface $SiO_2$ layer thereof under the conditions of an acceleration voltage of 40 keV and a dose of $5 \times 10^{16}$ $cm^{-2}$.

The surface of the $SiO_2$ layer of the first substrate and the surface of a fused-quartz substrate (second substrate) separately prepared were processed with a plasma, and were washed with water. Thereafter, the first and second substrates were placed on and touched with each other. When the touched substrate structure was annealed at 600° C., it was separated or divided into two parts near the projection range of the ion implantation. Since the ion-implanted layer was porous, the surfaces of the separated parts were rough. The surface on the second substrate side was selectively etched while a mixed solution consisting of 49% of fluoric acid, 30% of hydrogen peroxide and water was being stirred. The single-crystal Si of the SOI layer formed remained without being etched, and the ion-implanted layer was selectively etched and completely removed with the single-crystal Si as an etch stopping material.

Apart from the selective etching, non-selective etching or polishing can be employed for removing the ion-implanted layer. In case of the polishing, the surface of the SOI substrate formed need not be flattened by a heat treatment in hydrogen. However, in a case where polishing damages remain, it is more favorable to perform the heat treatment or to remove the surface layer of the SOI substrate.

The rate of the etching of the non-porous Si single crystal by the above etching liquid is very low, and the quantity of the etching of the Si single crystal (on the order of several tens angstroms) corresponds to a thickness decrease which is negligible in practical use.

Concretely, a single-crystal Si layer having a thickness of 0.2 $\mu$m could be formed on the transparent quartz substrate.

The thickness of the formed single-crystal Si layer was measured at 100 points over the whole surface of the SOI substrate. Then, the uniformity of the layer thickness was 201 nm±6 nm. When the number of COPs involved in the surface of the single-crystal Si layer was measured, it was about 80/W.

Further, the SOI substrate was subjected to a heat treatment at 1100° C. in hydrogen for one hour. When the surface roughness of the resulting SOI substrate was estimated with an interatomic-force microscope, the root-mean-square thereof ($R_{rms}$) in a region of 50 μm-square was about 0.2 nm and was equivalent to that of an ordinary Si wafer commercially available.

Even when the separated SOI substrate left intact is heat-treated in hydrogen without removing the remaining ion-implanted layer, the exclusion of micropores and defects and the flattening of the surface of the SOI layer are simultaneously caused by the migration of Si, with the result that the ion-implanted layer is extinguished.

The section of the Si layer was observed with a transmission electron microscope. As a result, it was confirmed that no new crystal defect was introduced into the Si layer, and that a good crystallinity was kept in the Si layer.

Also, the ion-implanted layer remaining on the first substrate side was selectively etched while the mixed solution consisting of 49% of fluoric acid, 30% of hydrogen peroxide and water was being stirred. Thereafter, the first substrate was subjected to a surface process such as hydrogen annealing or surface polishing. The resulting first substrate could be used as a new first substrate or a new second substrate again.

Even when the separated first substrate left intact is heat-treated in hydrogen without removing the remaining ion-implanted layer, the exclusion of micropores and defects and the flattening of the surface of the SOI layer are simultaneously caused by the migration of Si, with the result that the ion-implanted layer is extinguished.

EXAMPLE 5

There were prepared two, first single-crystal Si substrates (8 inches in diameter) fabricated by the CZ method. Each of the first substrates was heat-treated to enhance the quality of its surface layer. More specifically, the heat treatment was performed under the conditions of a mixed atmosphere consisting of 4% of $H_2$ gas and 96% of Ar gas, a temperature of 1100° C. and a time period of four hours. Thus, a less-defective layer was formed in the surface of the first substrate.

When the number of COPs involved in the surface layer of one of the two first substrates was measured, it was 30/W.

Subsequently, the surface of the other first substrate was formed with an $SiO_2$ layer of 200 nm by thermal oxidation. Besides, ions $H^+$ were implanted into the substrate through the surface $SiO_2$ layer thereof under the conditions of an acceleration voltage of 60 keV and a dose of $5\times10^{16}$ $cm^{-2}$.

The surface of the $SiO_2$ layer of the first substrate and the surface of a sapphire substrate (second substrate) separately prepared were processed with a plasma, and were washed with water. Thereafter, the first and second substrates were placed on and touched with each other. When the touched substrate structure was annealed at 600° C., it was separated or divided into two parts near the projection range of the ion implantation. Since the ion-implanted layer was porous, the surfaces of the separated parts were rough. The surface on the second substrate side was selectively etched while a mixed solution consisting of 49% of fluoric acid, 30% of hydrogen peroxide and water was being stirred. The single-crystal Si of the SOI layer formed remained without being etched, and the ion-implanted layer was selectively etched and completely removed with the single-crystal Si as an etch stopping material.

Apart from the selective etching, non-selective etching or polishing can be employed for removing the ion-implanted layer. In case of the polishing, the surface of the SOI substrate formed need not be flattened by a heat treatment in hydrogen. However, in a case where polishing damages remain, it is more favorable to perform the heat treatment or to remove the surface layer of the SOI substrate.

The rate of the etching of the non-porous Si single crystal by the above etching liquid is very low, and the quantity of the etching of the Si single crystal (on the order of several tens angstroms) corresponds to a thickness decrease which is negligible in practical use.

Thereafter, only the extreme surface of the non-porous Si single crystal was flattened by polishing.

Concretely, a single-crystal Si layer having a thickness of 0.4 μm could be formed on the transparent sapphire substrate. The thickness of the formed single-crystal Si layer was measured at 100 points over the whole surface of the SOI substrate. Then, the uniformity of the layer thickness was 402 nm±12 nm. When the number of COPs involved in the surface of the single-crystal Si layer was measured, it was about 120/W.

When the surface roughness of the resulting SOI substrate was estimated with an interatomic-force microscope, the root-mean-square thereof ($R_{rms}$) in a region of 50 μm-square was about 0.2 nm and was equivalent to that of an ordinary Si wafer commercially available.

The section of the Si layer was observed with a transmission electron microscope. As a result, it was confirmed that no new crystal defect was introduced into the Si layer, and that a good crystallinity was kept in the Si layer.

Also, the ion-implanted layer remaining on the first substrate side was selectively etched while the mixed solution consisting of 49% of fluoric acid, 30% of hydrogen peroxide and water was being stirred. Thereafter, the first substrate was subjected to a surface process such as hydrogen annealing or surface polishing. The resulting first substrate could be used as a new first substrate or a new second substrate again.

Even when the separated first substrate left intact is heat-treated in hydrogen without removing the remaining ion-implanted layer, the exclusion of micropores and defects and the flattening of the surface of the substrate are simultaneously caused by the migration of Si, with the result that the ion-implanted layer is extinguished.

EXAMPLE 6

There were prepared first single-crystal Si substrates fabricated by the CZ method. Each of the first substrates was heat-treated to enhance the quality of its surface layer. More specifically, hydrogen annealing as the heat treatment was performed under the conditions of an atmosphere of $H_2$ gas, a temperature of 1150° C. and a time period of 10 minutes.

Further, the surface of each of the first substrates was formed with an $SiO_2$ layer of 200 nm by thermal oxidation. Besides, ions $H^+$ were implanted into the substrate through the surface $SiO_2$ layer thereof under the conditions of an acceleration voltage of 70 keV and a dose of $5\times10^{16}$ $cm^{-2}$.

The surface of the $SiO_2$ layer of the first substrate and the surface of a glass substrate (second substrate) separately prepared were processed with a plasma, and were washed with water. Thereafter, the first and second substrates were placed on and touched with each other. When the touched substrate structure was annealed at 600° C., it was separated or divided into two parts near the projection range of the ion implantation. Since the ion-implanted layer was porous, the surfaces of the separated parts were rough. The surface on the second substrate side was selectively etched while a mixed solution consisting of 49% of fluoric acid, 30% of hydrogen peroxide and water was being stirred. The single-crystal Si of the SOI layer formed remained without being etched, and the ion-implanted layer was selectively etched and completely removed with the single-crystal Si as an etch stopping material.

Apart from the selective etching, non-selective etching or polishing can be employed for removing the ion-implanted layer. In case of the polishing, the surface of the SOI substrate formed need not be flattened by a heat treatment in hydrogen. However, in a case where polishing damages remain, it is more favorable to perform the heat treatment or to remove the surface layer of the SOI substrate.

The rate of the etching of the non-porous Si single crystal by the above etching liquid is very low, and the quantity of the etching of the Si single crystal (on the order of several tens angstroms) corresponds to a thickness decrease which is negligible in practical use.

Thereafter, only the extreme surface of the non-porous Si single crystal was flattened by polishing.

Concretely, a single-crystal Si layer having a thickness of 0.5 µm could be formed on the transparent glass substrate. The thickness of the formed single-crystal Si layer was measured at 100 points over the whole surface of the SOI substrate. Then, the uniformity of the layer thickness was 501 nm±15 nm. When the number of COPs involved in the surface of the single-crystal Si layer was measured, it was about 100/W. Since the number of COPs involved in the surface of an ordinary CZ wafer is 400/W or so, it is understood that the SOI layer is made much less defective according to the present invention.

When the surface roughness of the resulting SOI substrate was estimated with an interatomic-force microscope, the root-mean-square thereof ($R_{rms}$) in a region of 50 µm-square was about 0.2 nm and was equivalent to that of an ordinary Si wafer commercially available.

The section of the Si layer was observed with a transmission electron microscope. As a result, it was confirmed that no new crystal defect was introduced into the Si layer, and that a good crystallinity was kept in the Si layer.

Also, the ion-implanted layer remaining on the first substrate side was selectively etched while the mixed solution consisting of 49% of hydrofluoric acid, 30% of hydrogen peroxide and water was being stirred. Thereafter, the first substrate was subjected to a surface process such as hydrogen annealing or surface polishing. The resulting first substrate could be used as a new first substrate or a new second substrate again.

Even when the separated first substrate left intact is heat-treated in hydrogen without removing the remaining ion-implanted layer, the exclusion of micropores and defects and the flattening of the surface of the substrate are simultaneously caused by the migration of Si, with the result that the ion-implanted layer is extinguished.

EXAMPLE 7

There was prepared a first single-crystal Si substrate (8 inches in diameter) fabricated by the CZ method. After the surface of the substrate was formed with a silicon oxide layer of 200 nm by thermal oxidation, ions $H^+$ were implanted into the substrate through the surface $SiO_2$ layer thereof under the conditions of an acceleration voltage of 80 keV and a dose of $5 \times 10^{16}$ cm$^{-2}$. Thereafter, the silicon oxide film of 200 nm was etched and removed with HF liquid. Subsequently, the resulting first substrate was heat-treated to enhance the quality of its surface layer. As the heat treatment, hydrogen annealing was performed under the conditions of an atmosphere of $H_2$ gas, a temperature of 1200° C. and a time period of one hour. On this occasion, the number of COPs involved in the substrate surface was 8/W.

An oxide film ($SiO_2$) of 200 nm was formed on the first substrate by thermal oxidation again. Subsequently, the surface of the $SiO_2$ layer of the first substrate and the surface of a Si substrate (second substrate) separately prepared were placed on and touched with each other. When the touched substrate structure was annealed at 600° C., it was separated or divided into two parts near the projection range of the ion implantation. Since the ion-implanted layer was porous, the surfaces of the separated parts were rough. The surface on the second substrate side was selectively etched while a mixed solution consisting of 49% of hydrofluoric acid, 30% of hydrogen peroxide and water was being stirred. The single-crystal Si of the SOI layer formed remained without being etched, and the ion-implanted layer was selectively etched and completely removed with the single-crystal Si as an etch stopping material.

Apart from the selective etching, non-selective etching or polishing can be employed for removing the ion-implanted layer. In case of the polishing, the surface of the SOI substrate formed need not be flattened by a heat treatment in hydrogen. However, in a case where polishing damages remain, it is more favorable to perform the heat treatment or to remove the surface layer of the SOI substrate.

The rate of the etching of the non-porous Si single crystal by the above etching liquid is very low, and the quantity of the etching of the Si single crystal (on the order of several tens angstroms) corresponds to a thickness decrease which is negligible in practical use.

Concretely, a single-crystal Si layer having a thickness of 0.2 µm could be formed on the Si oxide film. The thickness of the formed single-crystal Si layer was measured at 100 points over the whole surface of the SOI substrate. Then, the uniformity of the layer thickness was 201 nm±6 nm.

Further, the SOI substrate was subjected to a heat treatment at 1100° C. in hydrogen for one hour. When the surface roughness of the resulting SOI substrate was estimated with an interatomic-force microscope, the root-mean-square thereof ($R_{rms}$) in a region of 50 µm-square was about 0.2 nm and was equivalent to that of an ordinary Si wafer commercially available. When the number of COPs involved in the surface of the single-crystal Si layer was measured, it was about 8/W.

Even when the separated SOI substrate left intact is heat-treated in hydrogen without removing the remaining ion-implanted layer, the exclusion of micropores and defects and the flattening of the surface of the SOI layer are simultaneously caused by the migration of Si, with the result that the ion-implanted layer is extinguished.

The section of the Si layer was observed with a transmission electron microscope. As a result, it was confirmed that no new crystal defect was introduced into the Si layer, and that a good crystallinity was kept in the Si layer.

Also, the ion-implanted layer remaining on the first substrate side was selectively etched while the mixed solution consisting of 49% of fluoric acid, 30% of hydrogen peroxide and water was being stirred. Thereafter, the first substrate was subjected to a surface process such as hydrogen annealing or surface polishing. The resulting first substrate could be used as a new first substrate or a new second substrate again.

Even when the separated first substrate left intact is heat-treated in hydrogen without removing the remaining ion-implanted layer, the exclusion of micropores and defects and the flattening of the surface of the substrate are simultaneously caused by the migration of Si, with the result that the ion-implanted layer is extinguished.

EXAMPLE 8

A first single-crystal Si substrate fabricated by the CZ method was prepared, and was heat-treated to enhance the quality of its surface layer. As the heat treatment, hydrogen annealing was performed under the conditions of an atmosphere of $H_2$ gas, a temperature of 1200° C. and a time period of three hours.

Further, the surface of the substrate was formed with an $SiO_2$ layer of 200 nm by thermal oxidation. Besides, ions $H^+$ were implanted into the substrate through the surface $SiO_2$ layer thereof under the conditions of an acceleration voltage of 40 keV and a dose of $5 \times 10^{16}$ cm$^{-2}$.

The surface of the $SiO_2$ layer of the first substrate and the surface of a Si substrate (second substrate) separately prepared were placed on and touched with each other.

After an oxide film on the rear surface of the first substrate was removed, the whole surface of the wafer (the touched substrate structure) was irradiated with the laser beam of a $CO_2$ laser from the first substrate side of the substrate structure. The laser beam of the $CO_2$ laser was absorbed by the $SiO_2$ layer of 200 nm at the bonding interface of the substrate structure, thereby to suddenly raise the temperatures of and near the $SiO_2$ layer. In consequence, the substrate structure was separated or divided into two parts near the projection range of the ion implantation by intense thermal stresses in an ion-implanted layer (separation layer formed by the ion implantation). The laser may be either a continuous-wave laser or a pulse laser.

Since the ion-implanted layer was porous, the surfaces of the separated parts were rough. The surface on the second substrate side was selectively etched while a mixed solution consisting of 49% of fluoric acid, 30% of hydrogen peroxide and water was being stirred. The single-crystal Si of the SOI layer formed remained without being etched, and the ion-implanted layer was selectively etched and completely removed with the single-crystal Si as an etch stopping material.

Apart from the selective etching, non-selective etching or polishing can be employed for removing the ion-implanted layer. In case of the polishing, the surface of the SOI substrate formed need not be flattened by a heat treatment in hydrogen. However, in a case where polishing damages remain, it is more favorable to perform the heat treatment or to remove the surface layer of the SOI substrate.

The rate of the etching of the non-porous Si single crystal by the above etching liquid is very low, and the quantity of the etching of the Si single crystal (on the order of several tens angstroms) corresponds to a thickness decrease which is negligible in practical use.

Concretely, a single-crystal Si layer having a thickness of 0.2 µm could be formed on the Si oxide film. The thickness of the formed single-crystal Si layer was measured at 100 points over the whole surface of the SOI substrate. Then, the uniformity of the layer thickness was 201 nm±6 nm.

Further, the SOI substrate was subjected to a heat treatment at 1100° C. in hydrogen for one hour. When the surface roughness of the resulting SOI substrate was estimated with an interatomic-force microscope, the root-mean-square thereof ($R_{rms}$) in a region of 50 µm-square was about 0.2 nm and was equivalent to that of an ordinary Si wafer commercially available. When the number of COPs involved in the surface of the single-crystal Si layer was measured, it was about 3/W.

Even when the separated SOI substrate left intact is heat-treated in hydrogen without removing the remaining ion-implanted layer, the exclusion of micropores and defects and the flattening of the surface of the SOI layer are simultaneously caused by the migration of Si, with the result that the ion-implanted layer is extinguished.

The section of the Si layer was observed with a transmission electron microscope. As a result, it was confirmed that no new crystal defect was introduced into the Si layer, and that a good crystallinity was kept in the Si layer.

Also, the ion-implanted layer remaining on the first substrate side was selectively etched while the mixed solution consisting of 49% of fluoric acid, 30% of hydrogen peroxide and water was being stirred. Thereafter, the first substrate was subjected to a surface process such as hydrogen annealing or surface polishing. The resulting first substrate could be used as a new first substrate or a new second substrate again.

Even when the separated first substrate left intact is heat-treated in hydrogen without removing the remaining ion-implanted layer, the exclusion of micropores and defects and the flattening of the surface of the substrate are simultaneously caused by the migration of Si, with the result that the ion-implanted layer is extinguished.

EXAMPLE 9

A first single-crystal Si substrate (8 inches in diameter) fabricated by the CZ method was prepared, and was heat-treated to enhance the quality of its surface layer. As the heat treatment, hydrogen annealing was performed under the conditions of an atmosphere of $H_2$ gas, a temperature of 1200° C. and a time period of one hour, thereby to form a less-defective layer.

The surface of the substrate was formed with an $SiO_2$ layer of 200 nm by thermal oxidation. Besides, ions $H^+$ were implanted into the substrate through the surface $SiO_2$ layer thereof under the conditions of an acceleration voltage of 40 keV and a dose of $5 \times 10^{16}$ cm$^{-2}$.

The surface of the $SiO_2$ layer of the first substrate and the surface of a Si substrate (second substrate) separately prepared were placed on and touched with each other. When the $SiO_2$ layer and single-crystal Si layer at the end face of the bonded wafer (substrate structure) were etched, the end of an ion-implanted layer (formed by the ion implantation) appeared.

When the resulting bonded wafer was subjected to pyrogenic oxidation at 1000° C., the two substrates were completely separated or detached within the ion-implanted layer in ten hours. When the peeled surfaces of the substrates were observed, the ion-implanted layer was turned into $SiO_2$ at the outer peripheral part of the wafer, but it was substantially unchanged at the central part of the wafer.

Thereafter, the ion-implanted layer remaining on the second substrate side was selectively etched while a mixed solution consisting of 49% of fluoric acid, 30% of hydrogen peroxide and water was being stirred. The single-crystal Si of the SOI layer formed remained without being etched, and the ion-implanted layer was selectively etched and completely removed with the single-crystal Si as an etch stopping material.

Apart from the selective etching, non-selective etching or polishing can be employed for removing the ion-implanted layer. In case of the polishing, the surface of the SOI substrate formed need not be flattened by a heat treatment in hydrogen. However, in a case where polishing damages remain, it is more favorable to perform the heat treatment or to remove the surface layer of the SOI substrate.

The rate of the etching of the non-porous Si single crystal by the above etching liquid is very low, and the selection ratio of the etching rate of the non-porous Si single crystal to that of the ion-implanted layer is as large as $10^5$ or above. Herein, the quantity of the etching of the non-porous layer (on the order of several tens angstroms) corresponds to a thickness decrease which is negligible in practical use.

Concretely, a single-crystal Si layer having a thickness of 0.2 µm could be formed on the Si oxide film. The thickness of the formed single-crystal Si layer was measured at 100 points over the whole surface of the SOI substrate. Then, the uniformity of the layer thickness was 201 nm±6 nm.

Further, the SOI substrate was subjected to a heat treatment at 1100° C. in hydrogen for two hours. When the surface roughness of the resulting SOI substrate was estimated with an interatomic-force microscope, the root-mean-square thereof ($R_{rms}$) in a region of 50 µm-square was about 0.2 nm and was equivalent to that of an ordinary Si wafer commercially available. When the number of COPs involved in the surface of the single-crystal Si layer was measured, it was about 8/W.

Even when the separated SOI substrate left intact is heat-treated in hydrogen without removing the remaining ion-implanted layer, the exclusion of micropores and defects and the flattening of the surface of the SOI layer are simultaneously caused by the migration of Si, with the result that the ion-implanted layer is extinguished.

The section of the Si layer was observed with a transmission electron microscope. As a result, it was confirmed that no new crystal defect was introduced into the Si layer, and that a good crystallinity was kept in the Si layer.

Also, the ion-implanted layer remaining on the first substrate side was selectively etched while the mixed solution consisting of 49% of fluoric acid, 30% of hydrogen peroxide and water was being stirred. Thereafter, the first substrate was subjected to a surface process such as hydrogen annealing or surface polishing. The resulting first substrate could be used as a new first substrate or a new second substrate again.

Even when the separated first substrate left intact is heat-treated in hydrogen without removing the remaining ion-implanted layer, the exclusion of micropores and defects and the flattening of the surface of the substrate are simultaneously caused by the migration of Si, with the result that the ion-implanted layer is extinguished.

EXAMPLE 10

A first single-crystal Si substrate (8 inches in diameter) fabricated by the CZ method was prepared, and was heat-treated to enhance the quality of its surface layer (into a less-defective layer). As the heat treatment, hydrogen annealing was performed under the conditions of an atmosphere of $H_2$ gas, a temperature of 1200° C. and a time period of one hour.

Further, the surface of the substrate was formed with an $SiO_2$ layer of 200 nm by thermal oxidation. Besides, ions $H^+$ were implanted into the substrate through the surface $SiO_2$ layer thereof under the conditions of an acceleration voltage of 40 keV and a dose of $5 \times 10^{16}$ cm$^{-2}$.

The surface of the $SiO_2$ layer of the first substrate and the surface of a Si substrate (second substrate) separately prepared were processed with a plasma, and were washed with water. Thereafter, the first and second substrates were placed on and touched with each other. The resulting substrate structure was heat-treated at 300° C. for one hour, thereby to heighten the bonding strength between the first and second substrates. When a wedge was entered into the bonded substrate structure from the periphery thereof, the structure was separated or divided into two parts near the projection range of the ion implantation. Since an ion-implanted layer (formed by the ion implantation) was porous, the surfaces of the separated parts were rough. The surface on the second substrate side was selectively etched while a mixed solution consisting of 49% of fluoric acid, 30% of hydrogen peroxide and water was being stirred. The single-crystal Si of an SOI layer formed remained without being etched, and the ion-implanted layer was selectively etched and completely removed with the single-crystal Si as an etch stopping material.

Apart from the selective etching, non-selective etching or polishing can be employed for removing the ion-implanted layer. In case of the polishing, the surface of the SOI substrate formed need not be flattened by a heat treatment in hydrogen. However, in a case where polishing damages remain, it is more favorable to perform the heat treatment or to remove the surface layer of the SOI substrate.

The rate of the etching of the non-porous Si single crystal by the above etching liquid is very low, and the quantity of the etching of the Si single crystal (on the order of several tens angstroms) corresponds to a thickness decrease which is negligible in practical use.

Concretely, a single-crystal Si layer having a thickness of 2.0 µm could be formed on the Si oxide film. The thickness of the formed single-crystal Si layer was measured at 100 points over the whole surface of the SOI substrate. Then, the uniformity of the layer thickness was 201 nm±6 nm.

Further, the SOI substrate was subjected to a heat treatment at 1100° C. in hydrogen for two hours. When the surface roughness of the resulting SOI substrate was estimated with an interatomic-force microscope, the root-mean-square thereof ($R_{rms}$) in a region of 50 µm-square was about 0.2 nm and was equivalent to that of an ordinary Si wafer commercially available. When the number of COPs involved in the surface of the single-crystal Si layer was measured, it was about 8/W. In the measurement of the COPs, the surface of the Si layer was washed with the SC-1 washing liquid, and the COPs whose particle sizes were about 0.1 µm or larger were measured by a foreign-matter inspection device.

Even when the separated SOI substrate left intact is heat-treated in hydrogen without removing the remaining ion-implanted layer, the exclusion of micropores and defects and the flattening of the surface of the SOI layer are simultaneously caused by the migration of Si, with the result that the ion-implanted layer is extinguished.

The section of the Si layer was observed with a transmission electron microscope. As a result, it was confirmed that no new crystal defect was introduced into the Si layer, and that a good crystallinity was kept in the Si layer.

Also, the ion-implanted layer remaining on the first substrate side was selectively etched while the mixed solution consisting of 49% of fluoric acid, 30% of hydrogen peroxide and water was being stirred. Thereafter, the first substrate was subjected to a surface process such as hydrogen annealing or surface polishing. The resulting first substrate could be used as a new first substrate or a new second substrate again.

Even when the separated first substrate left intact is heat-treated in hydrogen without removing the remaining ion-implanted layer, the exclusion of micropores and defects and the flattening of the surface of the substrate are simultaneously caused by the migration of Si, with the result that the ion-implanted layer is extinguished.

EXAMPLE 11

A first single-crystal Si substrate (8 inches in diameter) fabricated by the CZ method was prepared, and was heat-treated to enhance the quality of its surface layer. As the heat treatment, hydrogen annealing was performed under the conditions of an atmosphere of $H_2$ gas, a temperature of 1200° C. and a time period of two hours.

Further, the surface of the substrate was formed with an $SiO_2$ layer of 200 nm by thermal oxidation. Besides, ions $H^+$ were implanted into the substrate through the surface $SiO_2$ layer thereof under the conditions of an acceleration voltage of 40 keV and a dose of $5\times10^{16}$ cm$^{-2}$.

The surface of the $SiO_2$ layer of the first substrate and the surface of a Si substrate (second substrate) separately prepared were processed with a plasma, and were washed with water. Thereafter, the first and second substrates were placed on and touched with each other. The resulting substrate structure was heat-treated at 300° C. for one hour, thereby to heighten the bonding strength between the first and second substrates. When a shearing force was applied to the bonded substrate structure, the structure was separated or divided into two parts near the projection range of the ion implantation. Since an ion-implanted layer (formed by the ion implantation) was porous, the surfaces of the separated parts were rough. The surface on the second substrate side was selectively etched while a mixed solution consisting of 49% of fluoric acid, 30% of hydrogen peroxide and water was being stirred. The single-crystal Si of an SOI layer formed remained without being etched, and the ion-implanted layer was selectively etched and completely removed with the single-crystal Si as an etch stopping material.

Apart from the selective etching, non-selective etching or polishing can be employed for removing the ion-implanted layer. In case of the polishing, the surface of the SOI substrate formed need not be flattened by a heat treatment in hydrogen. However, in a case where polishing damages remain, it is more favorable to perform the heat treatment or to remove the surface layer of the SOI substrate.

The rate of the etching of the non-porous Si single crystal by the above etching liquid is very low, and the quantity of the etching of the Si single crystal (on the order of several tens angstroms) corresponds to a thickness decrease which is negligible in practical use.

Concretely, a single-crystal Si layer having a thickness of 0.2 μm could be formed on the Si oxide film. The thickness of the formed single-crystal Si layer was measured at 100 points over the whole surface of the SOI substrate. Then, the uniformity of the layer thickness was 201 nm±6 nm. When the number of COPs involved in the surface of the single-crystal Si layer was measured, it was 50/W.

Further, the SOI substrate was subjected to a heat treatment at 1100° C. in hydrogen for two hours. When the surface roughness of the resulting SOI substrate was estimated with an interatomic-force microscope, the root-mean-square thereof ($R_{rms}$) in a region of 50 μm-square was about 0.2 nm and was equivalent to that of an ordinary Si wafer commercially available. When the number of COPs involved in the surface of the single-crystal Si layer was measured after the heat treatment for two hours, it was 6/W.

Even when the separated SOI substrate left intact is heat-treated in hydrogen without removing the remaining ion-implanted layer, the exclusion of micropores and defects and the flattening of the surface of the SOI layer are simultaneously caused by the migration of Si, with the result that the ion-implanted layer is extinguished.

The section of the Si layer was observed with a transmission electron microscope. As a result, it was confirmed that no new crystal defect was introduced into the Si layer, and that a good crystallinity was kept in the Si layer.

Also, the ion-implanted layer remaining on the first substrate side was selectively etched while the mixed solution consisting of 49% of fluoric acid, 30% of hydrogen peroxide and water was being stirred. Thereafter, the first substrate was subjected to a surface process such as hydrogen annealing or surface polishing. The resulting first substrate could be used as a new first substrate or a new second substrate again.

Even when the separated first substrate left intact is heat-treated in hydrogen without removing the remaining ion-implanted layer, the exclusion of micropores and defects and the flattening of the surface of the substrate are simultaneously caused by the migration of Si, with the result that the ion-implanted layer is extinguished.

EXAMPLE 12

A first single-crystal Si substrate (8 inches in diameter) fabricated by the CZ method was prepared, and was heat-treated to enhance the quality of its surface layer. As the heat treatment, hydrogen annealing was performed under the conditions of an atmosphere of $H_2$ gas, a temperature of 1200° C. and a time period of one hour.

Further, the surface of the substrate was formed with an $SiO_2$ layer of 200 nm. Besides, hydrogen ions were implanted into the substrate through the surface $SiO_2$ layer thereof by the plasma-immersion ion implantation under the conditions of an acceleration voltage of 40 keV and a dose of $5\times10^{16}$ cm$^{-2}$.

The surface of the $SiO_2$ layer of the first substrate and the surface of a Si substrate (second substrate) separately prepared were placed on and touched with each other. When the resulting substrate structure was annealed at 600° C., it was separated or divided into two parts near the projection range of the ion implantation. Since an ion-implanted layer (formed by the ion implantation) was porous, the surfaces of the separated parts were rough. The surface on the second substrate side was selectively etched while a mixed solution consisting of 49% of fluoric acid, 30% of hydrogen peroxide and water was being stirred. The single-crystal Si of an SOI layer formed remained without being etched, and the ion-implanted layer was selectively etched and completely removed with the single-crystal Si as an etch stopping material.

Apart from the selective etching, non-selective etching or polishing can be employed for removing the ion-implanted layer. In case of the polishing, the surface of the SOI substrate formed need not be flattened by a heat treatment in hydrogen. However, in a case where polishing damages remain, it is more favorable to perform the heat treatment or to remove the surface layer of the SOI substrate.

The rate of the etching of the non-porous Si single crystal by the above etching liquid is very low, and the quantity of the etching of the Si single crystal (on the order of several tens angstroms) corresponds to a thickness decrease which is negligible in practical use.

Further, the remaining part of the first substrate corresponding to the depth of the ion implantation was removed by "oxidation+peeling" or "etching".

Concretely, a single-crystal Si layer having a thickness of 0.2 μm could be formed on the Si oxide film. The thickness of the formed single-crystal Si layer was measured at 100 points over the whole surface of the SOI substrate. Then, the uniformity of the layer thickness was 201 nm±7 nm.

Further, the SOI substrate was subjected to a heat treatment at 1100° C. in hydrogen for one hour. When the surface roughness of the resulting SOI substrate was estimated with an interatomic-force microscope, the root-mean-square thereof ($R_{rms}$) in a region of 50 μm-square was about 0.2 nm and was equivalent to that of an ordinary Si wafer commercially available. When the number of COPs involved in the surface of the single-crystal Si layer was measured, it was 10/W.

Even when the separated SOI substrate left intact is heat-treated in hydrogen without removing the remaining ion-implanted layer, the exclusion of micropores and defects and the flattening of the surface of the SOI layer are simultaneously caused by the migration of Si, with the result that the ion-implanted layer is extinguished.

The section of the Si layer was observed with a transmission electron microscope. As a result, it was confirmed that no new crystal defect was introduced into the Si layer, and that a good crystallinity was kept in the Si layer.

Also, the ion-implanted layer remaining on the first substrate side was selectively etched while the mixed solution consisting of 49% of fluoric acid, 30% of hydrogen peroxide and water was being stirred. Thereafter, the first substrate was subjected to a surface process such as hydrogen annealing or surface polishing. The resulting first substrate could be used as a new first substrate or a new second substrate again.

Even when the separated first substrate left intact is heat-treated in hydrogen without removing the remaining ion-implanted layer, the exclusion of micropores and defects and the flattening of the surface of the substrate are simultaneously caused by the migration of Si, with the result that the ion-implanted layer is extinguished.

EXAMPLE 13

Both the surfaces of a first substrate polished on both these surfaces were subjected to the same processing steps as in each of Examples 1 to 12.

In any of the foregoing examples, the liquid for selectively etching the ion-implanted layer is not restricted to the mixed solution consisting of 49% of fluoric acid, 30% of hydrogen peroxide and water. Since the ion implantation extends over a very large surface area, the ion-implanted layer can be selectively etched even with:

HF;

HF+Alcohol;

HF+$H_2O_2$+Alcohol;

Buffered HF+$H_2O_2$;

Buffered HF+Alcohol;

Buffered HF+$H_2O_2$+Alcohol;

Buffered HF;

or the like, or any of the proper mixed solutions of fluoric acid, nitric acid and acetic acid.

The other processing steps can also be performed under various conditions without being restricted to the conditions specified in the foregoing examples.

EXAMPLE 14

A boron-doped (100)-Si wafer of 8 inches having a resistivity of 10 Ω·cm and fabricated by the CZ method, was heat-treated at 1200° C., in a hydrogen atmosphere for one hour. Thereafter, the surface of the wafer was oxidized to form an oxide film of 250 nm, and the ions of hydrogen were implanted into the resulting wafer. The conditions of the ion implantation were an acceleration voltage of 50 keV and a dose of $4 \times 10^{16}/cm^2$. Thus, a first silicon wafer was prepared.

The first silicon wafer and a second silicon wafer were respectively formed with clean surfaces by subjecting them to the wet wash which is generally employed in silicon device processes. Thereafter, the first and second silicon wafers were bonded to each other so that the oxide film of 250 nm might lie inside. The bonded silicon wafer structure or assembly was set in a heat-treating furnace and was heat-treated at 600° C. for ten hours, thereby to heighten the bonding or adhesion strength of the bonding interface between the first and second silicon wafers. The atmosphere of the heat treatment was oxygen. In course of the heat treatment, the silicon wafer structure was separated or divided at its depth corresponding to the projection range of the ion implantation. The single-crystal silicon film of the first silicon wafer was transferred onto the second silicon wafer together with the silicon oxide film, whereby an SOI wafer was manufactured.

When the thicknesses of the transferred single-crystal silicon film were respectively measured at lattice points of 10 mm in the surface of the SOI wafer, the average value of the thicknesses was 280 nm, and the deviation thereof was ±10 nm. Besides, when the surface roughness of the single-crystal silicon film was measured at 256×256 measurement points in regions of 1 μm-square and 50 μm-square by the use of an interatomic-force microscope, they were 9.4 nm and 8.5 nm in terms of root-mean-square ($R_{rms}$) values, respectively.

Figure 22:
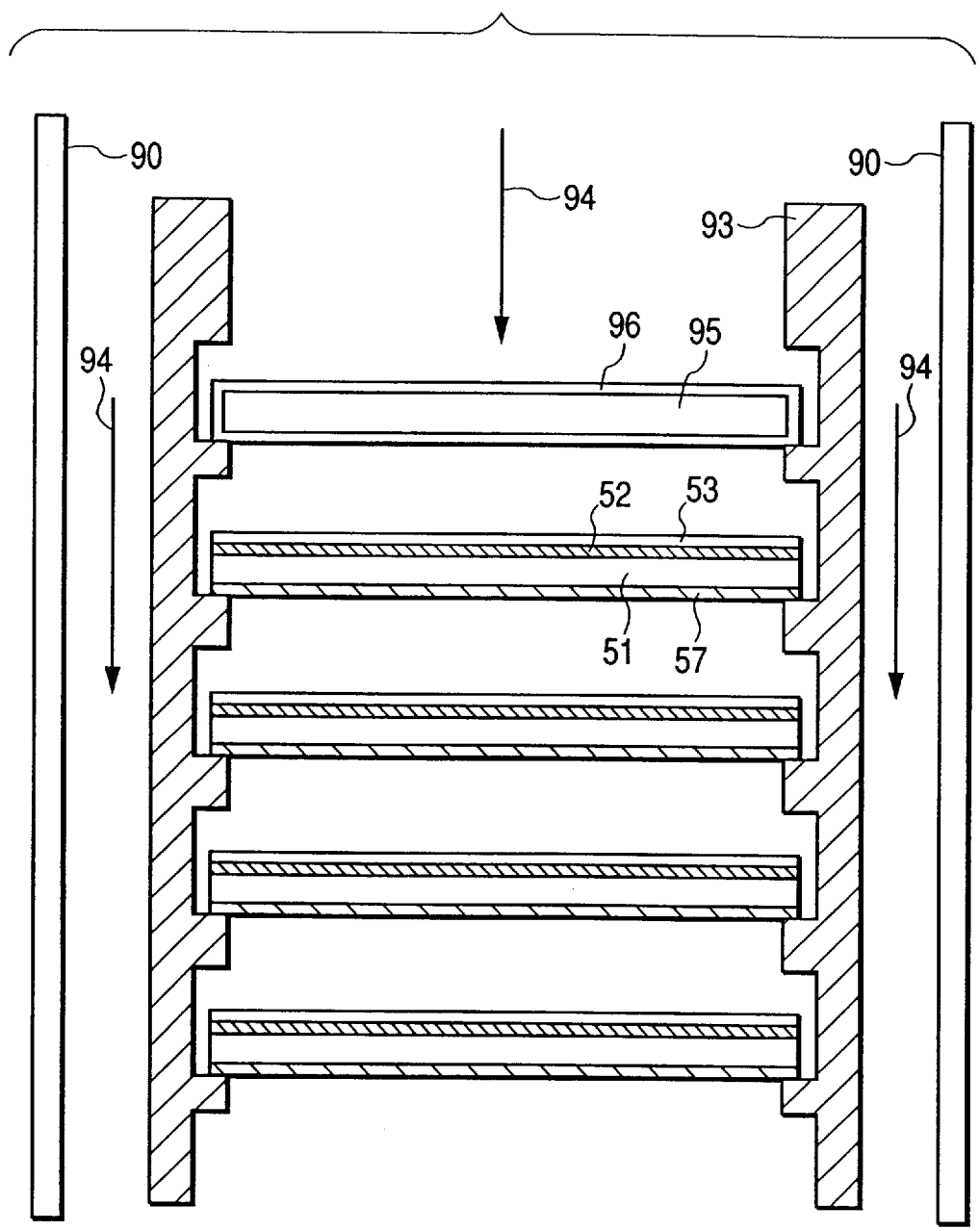
FIG. 22 is a schematic sectional view showing the arrangement of semiconductor substrates within a vertical type furnace, in the present invention.
Figure 24:
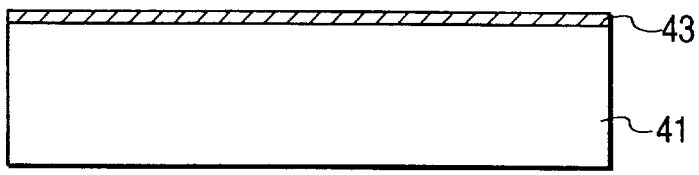
FIGS. 24, 25, 26, 27 and 28 are schematic sectional views showing a prior-art process for manufacturing an SOI substrate.
Figure 25:
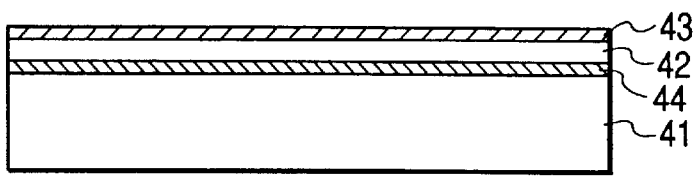
Figure 26:
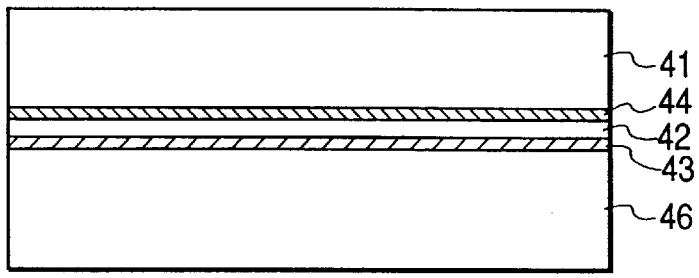
Figure 27:
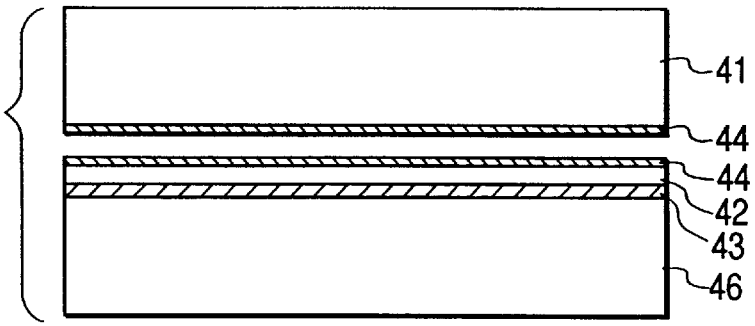
Figure 28:
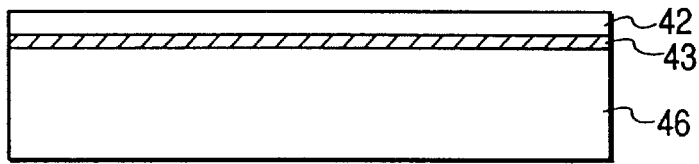

A plurality of such SOI wafers each bearing the silicon oxide film 57 at its rear surface were set in a vertical type heat-treating furnace including a core tube 90 made of quartz (illustrated in FIG. 22). A gas 94 was caused to flow downwards in the furnace. As shown in FIG. 22, the SOI wafers were horizontally put on a quartz-made boat 93 so that the silicon oxide film 57 at the rear surface of one of the SOI wafers might confront the front surface of the SOI layer 53 of another of the SOI wafers at a spacing of about 6 mm, and that the centers of the SOI wafers might agree with the axis of the core tube 90. Further, a silicon wafer 95 commercially available, which was formed with a silicon oxide film 96 on the whole surface thereof, was arranged over the uppermost SOI wafer at the same spacing. After the atmosphere gas in the furnace was replaced with hydrogen, the temperature of the interior of the furnace was raised up to 1180° C., which was held for two hours. Subsequently, the temperature was lowered again. The wafers were taken out, and the thickness of the SOI layers 53 was measured again. The decrement of the thickness of the SOI wafers was 80.3 nm on the average, and the SOI layers 53 became 199.6 nm thick. Herein, when the number of COPs involved in each SOI layer was measured, it was about 9/W.

In addition, the surface roughness of the single-crystal silicon films subjected to the heat treatment was measured with the interatomic-force microscope. Then, the root-mean-square ($R_{rms}$) value of the roughness was 0.11 nm in the region of 1 μm-square and 0.35 nm in the region of 50 μm-square. That is, the single-crystal silicon films were smoothened equivalently to those of ordinary silicon wafers commercially available. Also, the concentration of boron in the single-crystal silicon films was measured by the secondary-ion mass spectroscopy (SIMS) after the heat treatment. Then, the boron concentration was lowered to $5 \times 10^{15}/cm^3$ or less in all the films and was low enough to produce semiconductor devices.

Besides, when the state of the sections of the SOI layers was observed with a TEM (transmission electron microscope) before and after the heat treatment in the hydrogen atmosphere, a group of dislocations noted in the vicinity of the surface of each SOI layer before the heat treatment were not noted after the heat treatment. This is so construed that the dislocations involved in the partial region of the SOI layer removed by the etching based on the heat treatment will have been eliminated together with the SOI layer region by the etching.

EXAMPLE 15

A first single-crystal Si substrate fabricated by the CZ method was prepared, and was heat-treated to enhance the quality of its surface layer. As the heat treatment, hydrogen annealing was performed under the conditions of an atmosphere of $H_2$ gas, a temperature of 1200° C. and a time period of one hour.

Further, the surface of the substrate was formed with an $SiO_2$ layer of 200 nm by thermal oxidation. Besides, ions $H^+$ were implanted into the substrate through the surface $SiO_2$ layer thereof under the conditions of an acceleration voltage of 40 keV and a dose of $5 \times 10^{16}$ cm$^{-2}$.

The surface of the $SiO_2$ layer of the first substrate and the surface of a Si substrate (second substrate) separately prepared were processed with a plasma, and were washed with water. Thereafter, the first and second substrates were placed on and touched with each other. The resulting substrate structure (wafer structure) was heat-treated at 300° C. for one hour, thereby to heighten the bonding strength between the first and second substrates. When a water jet having a diameter of 0.2 mm was sprayed into the beveling gap of the bonded wafer structure, this bonded wafer structure was separated or divided into two wafers through an ion-implanted layer (formed by the ion implantation). Since the ion-implanted layer was porous, the surfaces of the separated wafers were rough. The surface on the second substrate side was selectively etched while a mixed solution consisting of 49% of fluoric acid, 30% of hydrogen peroxide and water was being stirred. The single-crystal Si of an SOI layer formed remained without being etched, and the ion-implanted layer was selectively etched and completely removed with the single-crystal Si as an etch stopping material.

Apart from the selective etching, non-selective etching or polishing can be employed for removing the ion-implanted layer. In case of the polishing, the surface of the SOI substrate formed need not be flattened by a heat treatment in hydrogen. However, in a case where polishing damages remain, it is more favorable to perform the heat treatment or to remove the surface layer of the SOI substrate.

The rate of the etching of the non-porous Si single crystal by the above etching liquid is very low, and the quantity of the etching of the Si single crystal (on the order of several tens angstroms) corresponds to a thickness decrease which is negligible in practical use.

Concretely, a single-crystal Si layer having a thickness of 0.2 μm could be formed on the Si oxide film. The thickness of the formed single-crystal Si layer was measured at 100 points over the whole surface of the SOI substrate. Then, the uniformity of the layer thickness was 201 nm±6 nm.

Further, the SOI wafer was subjected to a heat treatment at 1100° C. in hydrogen for one hour. When the surface roughness of the resulting SOI wafer was estimated with an interatomic-force microscope, the root-mean-square thereof ($R_{rms}$) in a region of 50 μm-square was about 0.2 nm and was equivalent to that of an ordinary Si wafer commercially available. When the number of COPs involved in the surface of the single-crystal Si layer was measured, it was 7/W.

Even when the separated SOI wafer left intact is heat-treated in hydrogen without removing the remaining ion-implanted layer, the exclusion of micropores and defects and the flattening of the surface of the SOI layer are simultaneously caused by the migration of Si, with the result that the ion-implanted layer is extinguished.

The section of the Si layer was observed with a transmission electron microscope. As a result, it was confirmed that no new crystal defect was introduced into the Si layer, and that a good crystallinity was kept in the Si layer.

Also, the ion-implanted layer remaining on the first substrate side was selectively etched while the mixed solution consisting of 49% of fluoric acid, 30% of hydrogen peroxide and water was being stirred. Thereafter, the first substrate was subjected to a surface process such as hydrogen annealing or surface polishing. The resulting first substrate could be used as a new first substrate or a new second substrate again.

Even when the separated first substrate left intact is heat-treated in hydrogen without removing the remaining ion-implanted layer, the exclusion of micropores and defects and the flattening of the surface of the substrate are simultaneously caused by the migration of Si, with the result that the ion-implanted layer is extinguished.

EXAMPLE 16

Using a CZ-Si wafer, an SOI substrate was manufactured by the following steps:

(1) First, the CZ-Si wafer was prepared and was heat-treated at 1200° C., in $H_2$ gas and for one hour, thereby to form a less-defective layer. Incidentally, a CZ-Si wafer which was not passed through this step (1) (in other words, which was not subjected to the heat treatment in hydrogen) was also prepared as a comparative example.

(2) Each Si wafer was thermally oxidized to form an oxide ($SiO_2$) layer of 200 nm.

(3) Ions $H^+$ were implanted under the conditions of a dose of $5 \times 10^{16}/cm^2$ and an acceleration voltage of 40 keV, thereby to form a separation layer.

(4) The Si wafer and a second substrate (here, a Si substrate) were bonded to each other with the oxide layer lying inside.

(5) The bonded wafer structure was heat-treated at 600° C., thereby to be separated or divided at the ion-implanted layer (separation layer).

(6) The ion-implanted layer remaining on the second substrate was selectively etched with a mixed solution consisting of HF, $H_2O_2$ and water. The semiconductor layer (SOI layer) of the SOI substrate thus formed had a thickness of 200 nm±6 nm.

(7) The SOI substrate was heat-treated at 1100° C., in hydrogen for four hours.

(8) Each SOI substrate was immersed in a solution of 49% HF for 15 minutes. It was thereafter observed with an optical microscope.

Regarding the SOI substrate in which the SOI layer was the less-defective layer formed by the hydrogen annealing of the step (1), when a region of 20 cm² in the surface of the SOI layer was observed, a point where the buried oxide film was etched was not found. Strictly, the density of such points was below 0.05/cm². On the other hand, regarding the SOI substrate which employed the Si wafer of the comparative example not formed with the less-defective layer, the points where the buried oxide film was etched with diametrical sizes of about 100 μm were found at a density of 3.2/cm². This comes from the fact that COPs involved in the Si wafer of the comparative example not having undergone the hydrogen annealing were succeeded to by the SOI layer, and that the HF solution into the SOI layer through the positions of the COPs to etch the buried oxide film. Silicon does not exist at the etched points, and a semiconductor device produced becomes a defective unit.

Further, after the defects were actualized by the Secco etching, the SOI substrates were observed with the optical microscope. Then, in the SOI substrate which employed the Si wafer subjected to the hydrogen annealing, the density of etch pits being the defects such as FPDs, COPs and OSFs was $10^2$/cm². On the other hand, in the SOI substrate which employed the Si wafer of the comparative example not subjected to the hydrogen annealing, the density of etch pits was $10^4$/cm².

As thus far described, according to the present invention, a layer in which COPs etc. have been lessened by heat-treating a wafer in an atmosphere containing hydrogen can be transferred to another substrate by separating a bonded substrate structure (of the wafer and the substrate) through an ion-implanted layer. Defects inherent in bulk Si as explained before can be excluded or lessened in the SOI layer of an SOI substrate by the annealing in the reducing atmosphere containing hydrogen, so that the available percentage of a semiconductor device can be enhanced.

Besides, uniformity in the thickness of the SOI layer can be enhanced in such a way that the separation layer is formed by implanting ions into the less-defective layer.

Moreover, according to the present invention, even in case of producing a large-scale integrated circuit of SOI structure, it is possible to propose a process for manufacturing a semiconductor substrate which can substitute for an expensive SOS or SIMOX.

Furthermore, according to the present invention, even in case of batching a plurality of semiconductor substrate members each of which has a single-crystal silicon film at its surface, silicon can be etched while the quantity of removal of the thickness of the single-crystal silicon is being controlled. Therefore, when such an operation is applied to SOI substrates, it is simultaneously realized to flatten the surface of each single-crystal silicon film, to lower the boron concentration thereof and to etch the silicon thereof, with the uniformity of the film thickness kept.

What is claimed is:

1. A process for manufacturing a semiconductor substrate comprising the steps of:
    preparing a first substrate comprising a non-epitaxial silicon wafer, said preparation step containing the step of hydrogen annealing said first substrate in a reducing atmosphere which contains hydrogen so as to modify a surface layer portion of said first substrate to be less defective than the inside portion of said first substrate;
    implanting ions of at least one element selected from the group consisting of hydrogen, nitrogen and rare gases, into said first substrate from the side of said modified portion, thereby forming a separation layer within said modified portion;
    bonding said first substrate and a second substrate to each other so that said modified portion lies inside, thereby forming a multilayer structure; and
    separating said multilayer structure at said separation layer, thereby transferring at least part of said modified portion onto said second substrate.

2. A process for manufacturing a semiconductor substrate as defined in claim 1, wherein the hydrogen annealing is heat-treating a single-crystal silicon substrate in a reducing atmosphere which contains hydrogen.

3. A process for manufacturing a semiconductor substrate as defined in claim 2, wherein said single-crystal silicon substrate is a CZ silicon wafer.

4. A process for manufacturing a semiconductor substrate as defined in claim 2, wherein said single-crystal silicon substrate is an MCZ silicon wafer.

5. A process for manufacturing a semiconductor substrate as defined in claim 2, wherein said surface layer portion is a less-defective layer in which the number of COPs (Crystal Originated Particles), FPDs (Flow Pattern Defects) or OSFs (Oxidation Induced Stacking Faults) in a single-crystal silicon substrate is smaller than in any other region of the same substrate.

6. A process for manufacturing a semiconductor substrate as defined in claim 2, wherein the hydrogen annealing is performed at a temperature between 800° C. and the melting temperature of said first substrate inclusive.

7. A process for manufacturing a semiconductor substrate as defined in claim 2, wherein the hydrogen annealing is performed at a temperature between 900° C. and 1350° C. inclusive.

8. A process for manufacturing a semiconductor substrate as defined in claim 1, wherein the density of COPs involved in said surface layer portion is between 0/cm³ and $5 \times 10^6$/cm³ inclusive.

9. A process for manufacturing a semiconductor substrate as defined in claim 1, wherein the density of COPs involved in said surface layer portion is between 0/cm³ and $1 \times 10^6$/cm³ inclusive.

10. A process for manufacturing a semiconductor substrate as defined in claim 1, wherein the density of COPs involved in said surface layer portion is between 0/cm³ and $1 \times 10^5$/cm³ inclusive.

11. A process for manufacturing a semiconductor substrate as defined in any of claims 8 to 10, wherein said density of COPs is the number of COPs per unit volume (1 cm³) in a region of a depth which extends from the outermost surface of said surface layer portion to said separation layer.

12. A process for manufacturing a semiconductor substrate as defined in claim 1, wherein the number of COPs per unit wafer in a surface of said surface layer portion is between 0 and 500 inclusive.

13. A process for manufacturing a semiconductor substrate as defined in claim 1, wherein the number of COPs per unit wafer in a surface of said surface layer portion is between 0 and 100 inclusive.

14. A process for manufacturing a semiconductor substrate as defined in claim 1, wherein the number of COPs per unit wafer in a surface of said surface layer portion is between 0 and 10 inclusive.

15. A process for manufacturing a semiconductor substrate as defined in claim 1, wherein the number of COPs per unit area in a surface of said surface layer portion is between 0/cm² and 1.6/cm² inclusive.

16. A process for manufacturing a semiconductor substrate as defined in claim 1, wherein the number of COPs per unit area in a surface of said surface layer portion is between $0/cm^2$ and $0.5/cm^2$ inclusive.

17. A process for manufacturing a semiconductor substrate as defined in claim 1, wherein the number of COPs per unit area in a surface of said surface layer portion is between $0/cm^2$ and $0.05/cm^2$ inclusive.

18. A process for manufacturing a semiconductor substrate as defined in claim 1, wherein the number of OSFs per unit area in a surface of said surface layer portion is between $0/cm^2$ and $10/cm^2$ inclusive.

19. A process for manufacturing a semiconductor substrate as defined in claim 1, wherein the number of FPDs per unit area in a surface of said surface layer portion is between $0/cm^2$ and $5\times10^2/cm^2$ inclusive, and more preferably between $0/cm^2$ and $1\times10^2/cm^2$ inclusive.

20. A process for manufacturing a semiconductor substrate as defined in claim 1, wherein an oxygen concentration in a surface of said surface layer portion is below $5\times10^{17}$ atoms/$cm^3$.

21. A process for manufacturing a semiconductor substrate as defined in claim 5, wherein said separation layer is formed within said less-defective layer.

22. A process for manufacturing a semiconductor substrate as defined in claim 1, wherein said separation-layer formation step is performed with an implantation dose ranging from $1.0\times10^{16}/cm^2$ to $2.0\times10^{17}/cm^2$ inclusive.

23. A process for manufacturing a semiconductor substrate as defined in claim 1, wherein said separation layer is a crowd of microbubbles.

24. A process for manufacturing a semiconductor substrate as defined in claim 1, wherein said separation-layer formation step is performed by plasma ion implantation.

25. A process for manufacturing a semiconductor substrate as defined in claim 1, wherein said separation-layer formation step is performed by ion implantation which is done after an insulator layer has been formed on said surface layer portion.

26. A process for manufacturing a semiconductor substrate as defined in claim 1, wherein said bonding step is performed by interposing an insulator layer between said first substrate and said second substrate.

27. A process for manufacturing a semiconductor substrate as defined in either of claims 25 and 26, wherein said insulator layer is a thermal oxidation film which is formed by thermally oxidizing a surface of said surface layer portion.

28. A process for manufacturing a semiconductor substrate as defined in claim 1, wherein said second substrate is a member selected from the group consisting of a single-crystal silicon substrate, a quartz substrate, a glass substrate and a compound semiconductor substrate.

29. A process for manufacturing a semiconductor substrate as defined in claim 1, wherein said bonding step is performed by a processing step which includes a heat treatment at a temperature between a room temperature and 400° C. inclusive.

30. A process for manufacturing a semiconductor substrate as defined in claim 1, wherein said transfer step is performed by separating said multilayer structure within said separation layer, at an interface between said separation layer and said surface layer portion, at an interface between said separation layer and said first substrate, or by a combination of at least two of them.

31. A process for manufacturing a semiconductor substrate as defined in claim 1, wherein said transfer step is performed by heat-treating said multilayer structure at a temperature between 400° C. and 1000° C. inclusive.

32. A process for manufacturing a semiconductor substrate as defined in claim 1, wherein said transfer step is performed by heat-treating said multilayer structure at a temperature between 400° C. and 600° C. inclusive.

33. A process for manufacturing a semiconductor substrate as defined in claim 1, wherein said transfer step is performed by spraying a fluid against a side surface of said multilayer structure.

34. A process for manufacturing a semiconductor substrate as defined in claim 33, wherein said fluid is a member selected from the group consisting of water, air, nitrogen gas, carbonic acid gas and rare gases.

35. A process for manufacturing a semiconductor substrate as defined in claim 1, wherein said transfer step is performed by applying either of a tensile force and a shearing force to said multilayer structure.

36. A process for manufacturing a semiconductor substrate as defined in claim 1, further comprising the step of removing said separation layer which remains on said surface layer portion overlying said second substrate, after said transfer step.

37. A process for manufacturing a semiconductor substrate as defined in claim 36, wherein said step of removing said separation layer is performed by a heat treatment which is done in a reducing atmosphere containing hydrogen.

38. A process for manufacturing a semiconductor substrate as defined in claim 36, wherein said step of removing said separation layer is the etching step of immersing said separation layer in a member selected from the group consisting of hydrofluoric acid, a mixed solution in which at least either of alcohol and hydrogen peroxide is added to hydrofluoric acid, buffered hydrofluoric acid, and a mixed solution in which at least either of alcohol and hydrogen peroxide is added to buffered fluoric acid, whereby said separation layer is selectively subjected to electroless wet chemical etching and is removed.

39. A process for manufacturing a semiconductor substrate as defined in claim 36, wherein said step of removing said separation layer is performed by polishing said separation layer which remains on said second substrate.

40. A process for manufacturing a semiconductor substrate as defined in claim 36, wherein said step of removing said separation layer is performed by chemimechanical polishing.

41. A process for manufacturing a semiconductor substrate as defined in any of claims 38, 39 and 40, wherein after said step of removing said separation layer remaining on said second substrate by the polishing or the etching, said surface layer portion of said first substrate transferred on said second substrate is heat-treated in a reducing atmosphere containing hydrogen.

42. A process of manufacturing a semiconductor substrate as defined in claim 1, wherein the number of COPs per unit wafer decreases with a depth of said surface layer portion of said first substrate transferred on said second substrate as measured from an outside surface thereof.

43. A process for manufacturing a semiconductor substrate as defined in claim 1, further comprising the step of heat-treating said surface layer portion of said first substrate transferred on said second substrate, in a reducing atmosphere containing hydrogen, after said transfer step.

44. A process for manufacturing a semiconductor substrate as defined in claim 43, wherein the heat treatment is performed at a temperature between 800° C. and the melting temperature of said first substrate inclusive.

45. A process for manufacturing a semiconductor substrate as defined in claim 43, wherein the heat treatment is performed at a temperature between 900° C. and 1350° C. inclusive.

46. A process for manufacturing a semiconductor substrate as defined in either of claims 37 and 43, wherein the heat treatment is performed by arranging a surface of said surface layer portion of said first substrate transferred on said second substrate, in opposition to silicon oxide.

47. A process for manufacturing a semiconductor substrate as defined in either of claims 1 and 43, wherein after said transfer step, the number of COPs involved per unit wafer in a surface of said surface layer portion is between 0 and 100 inclusive.

48. A process for manufacturing a semiconductor substrate as defined in either of claims 1 and 43, wherein after said transfer step, the number of COPs involved per unit wafer in a surface of said surface layer portion is between 0 and 10 inclusive.

49. A process for manufacturing a semiconductor substrate as defined in either of claims 1 and 43, wherein after said transfer step, the number of COPs involved per unit area in a surface of said surface layer portion is between $0/cm^2$ and $0.5/cm^2$ inclusive.

50. A process for manufacturing a semiconductor substrate as defined in either of claims 1 and 43, wherein after said transfer step, the number of COPs involved per unit area in a surface of said surface layer portion is between $0/cm^2$ and $0.05/cm^2$ inclusive.

51. A process for manufacturing a semiconductor substrate comprising the steps of:

preparing a CZ or MCZ silicon wafer which has a surface layer portion subjected to hydrogen annealing;

implanting ions of at least one element selected from the group consisting of hydrogen, nitrogen and rare gases, into said surface layer portion of said CZ or MCZ silicon wafer, thereby forming a separation layer within said surface layer portion;

bonding said CZ or MCZ silicon wafer and a support substrate to each other, thereby forming a multilayer structure;

heat-treating said multilayer structure at a first heat-treating temperature;

separating said multilayer structure by utilizing said separation layer, thereby transferring at least part of said surface layer portion onto said support substrate; and heat-treating said surface layer portion transferred on said support substrate, at a second heat-treating temperature which is higher than the first heat-treating temperature, wherein said surface layer portion is modified by said hydrogen annealing so as to decrease the number of crystal originated particles in said surface layer portion.

52. A process for manufacturing a semiconductor substrate as defined in claim 51, wherein the first heat-treating temperature is between a room temperature and 500° C. inclusive, while the second heat-treating temperature is between 800° C. and the melting temperature of silicon inclusive.

53. A process for manufacturing a semiconductor thin film comprising the steps of:

preparing a CZ or MCZ silicon wafer which has a surface layer portion subjected to hydrogen annealing;

implanting ions of at least one element selected from the group consisting of hydrogen, nitrogen and rare gases, into said CZ or MCZ silicon wafer, thereby forming a separation layer within said surface layer portion; and separating at least part of said surface layer portion at said separation layer, wherein said surface layer portion is modified by said hydrogen annealing so as to decrease the number of crystal originated particles in said surface layer portion.

54. A process for manufacturing a semiconductor thin film as defined in claim 53, wherein the hydrogen annealing is heat-treating said surface layer portion in a reducing atmosphere which contains hydrogen.

55. A process for manufacturing a semiconductor thin film as defined in claim 54, wherein the heat treatment is performed within a temperature range of 800° C. to the melting temperature of silicon inclusive.

56. A process for manufacturing a semiconductor thin film as defined in claim 53, wherein after said separation step, the number of COPs involved per unit wafer in a surface of said surface layer portion is between 0 and 100 inclusive.

57. A process for manufacturing a semiconductor thin film as defined in claim 53, wherein after said separation step, the number of COPs involved per unit wafer in a surface of said surface layer portion is between 0 and 10 inclusive.

58. A process for manufacturing a semiconductor thin film as defined in claim 53, wherein after said separation step, the number of COPs involved per unit area in a surface of said surface layer portion is between $0/cm^2$ and $0.5/cm^2$ inclusive.

59. A process for manufacturing a semiconductor thin film as defined in claim 53, wherein after said separation step, the number of COPs involved per unit area in a surface of said surface layer portion is between $0/cm^2$ and $0.05/cm^2$ inclusive.

60. A process for manufacturing a semiconductor substrate comprising the steps of:

heat-treating a CZ or MCZ silicon wafer in a reducing atmosphere which contains hydrogen to modify a surface layer portion of said CZ or MCZ silicon wafer;

implanting ions of at least one element selected from the group consisting of hydrogen, nitrogen and rare gases, into said modified surface layer portion of said CZ or MCZ silicon wafer, thereby forming a separation layer;

bonding said CZ or MCZ silicon wafer and a support substrate to each other, thereby forming a multilayer structure;

separating said multilayer structure at said separation layer, thereby transferring at least part of said modified surface layer portion onto said support substrate, wherein the number of crystal originated particles in said modified surface layer portion is smaller than that in said surface layer portion prior to modification.

* * * * *

UNITED STATES PATENT AND TRADEMARK OFFICE
CERTIFICATE OF CORRECTION

PATENT NO. : 6,613,678 B1
DATED : September 2, 2003
INVENTOR(S) : Kiyofumi Sakaguchi et al.

It is certified that error appears in the above-identified patent and that said Letters Patent is hereby corrected as shown below:

Title page,
Item [*] Notice, insert -- This patent issued on ancontinued prosecution application filed under 37 CFR 1.53(d), and is subject to the twenty year patent term provisions of 35 U.S.C. 154(a)(2). --.

Figure 1:
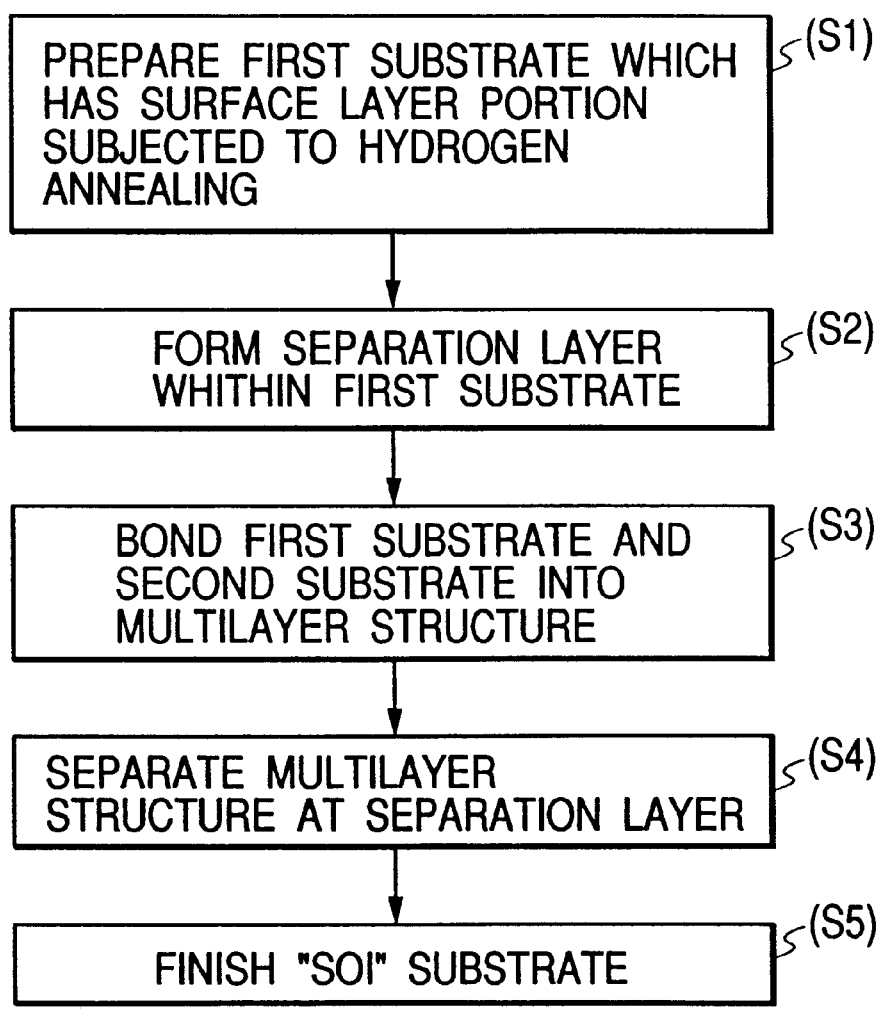
FIG. 1 is a flow chart showing an example of a process for manufacturing a semiconductor substrate in accordance with the present invention.

Drawings,
Sheet 1, Figure 1, "WHITHIN" should read -- WITHIN --.

Column 2,
Line 16, "being" should be deleted.

Column 4,
Line 33, "contain" should read -- contains --.

Column 7,
Line 3, "OSFS," should read -- OSFs, --.

Column 10,
Line 19, "case" should read -- a case --.

Column 11,
Line 30, "plantation" should read -- implantation --.

Column 12,
Line 2, "is rapidly" should read -- are rapidly --.

Column 18,
Line 10, "capable" should read -- being capable --.

Column 20,
Line 26, "tions;" should read -- tions: --.

Column 22,
Line 38, "500º" should read -- 500ºC --.
Line 49, "increase" should read -- increases --.

UNITED STATES PATENT AND TRADEMARK OFFICE
CERTIFICATE OF CORRECTION

PATENT NO.      : 6,613,678 B1
DATED           : September 2, 2003
INVENTOR(S)     : Kiyofumi Sakaguchi et al.

It is certified that error appears in the above-identified patent and that said Letters Patent is hereby corrected as shown below:

<u>Column 23,</u>
Line 5, "not" should be deleted.
Line 13, "Yonehara" should read -- Yonehara, --.
Line 14, "et al." should read -- et al., --.
Line 44, "Sakaguchi" should read -- Sakaguchi, --.
Line 45, "et al." should read -- et al., --.

<u>Column 25,</u>
Line 48, "methods;" should read -- methods: --.

<u>Column 29,</u>
Line 11, "comprising" should read -- comprised --.

<u>Column 40,</u>
Line 30, "case" should read -- a case --.

Signed and Sealed this

Sixth Day of April, 2004

JON W. DUDAS
*Acting Director of the United States Patent and Trademark Office*